(12) United States Patent
Cui et al.

(10) Patent No.: US 12,426,445 B1
(45) Date of Patent: Sep. 23, 2025

(54) DEVICES WITH DISPLAYS HAVING TRANSPARENT OPENINGS AND SHORTED PIXELS

(71) Applicant: Apple Inc., Cupertino, CA (US)

(72) Inventors: Yue Cui, Campbell, CA (US); Ricardo A Peterson, Mountain View, CA (US); Yuchi Che, Santa Clara, CA (US); Shyuan Yang, San Mateo, CA (US); Warren S Rieutort-Louis, Cupertino, CA (US); Tsung-Ting Tsai, San Jose, CA (US); Yi Qiao, San Jose, CA (US); Jean-Pierre S Guillou, La Jolla, CA (US); Abbas Jamshidi Roudbari, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 669 days.

(21) Appl. No.: 17/674,481

(22) Filed: Feb. 17, 2022

Related U.S. Application Data

(60) Provisional application No. 63/256,438, filed on Oct. 15, 2021, provisional application No. 63/173,981, (Continued)

(51) Int. Cl.
*H10K 59/121* (2023.01)
*G09G 3/3208* (2016.01)
(Continued)

(52) U.S. Cl.
CPC ....... *H10K 59/1213* (2023.02); *G09G 3/3208* (2013.01); *H10K 59/131* (2023.02);
(Continued)

(58) Field of Classification Search
CPC ............. H10K 59/1213; H10K 59/131; H10K 59/121; H10K 59/123; H10K 59/179;
(Continued)

(56) References Cited

U.S. PATENT DOCUMENTS 7,355,606 B2 4/2008 Paquette
7,781,979 B2 8/2010 Lys
(Continued)

FOREIGN PATENT DOCUMENTS

CN 110634445 A * 12/2019 ........... G09G 3/3208

*Primary Examiner* — Amr A Awad
*Assistant Examiner* — Aaron Midkiff
(74) *Attorney, Agent, or Firm* — Treyz Law Group, P.C.; Joseph F. Guihan; Jinie M. Guihan

(57) ABSTRACT

An electronic device may include a display and an optical sensor formed underneath the display. The display may have both a full pixel density region and a high-transmittance region that overlaps the optical sensor. To increase the transmittance of light through the high-transmittance region of the display, emissive sub-pixels in the high-transmittance region may be shorted together. Each emissive sub-pixel may be shorted to an emissive sub-pixel of the same color. The emissive sub-pixels in the high-transmittance region of the display may have the same layout but smaller sizes relative to the full pixel density region of the display. The thin-film transistor sub-pixels in the high-transmittance region may be consolidated horizontally and/or vertically to produce larger continuous high-transmittance areas.

15 Claims, 24 Drawing Sheets

Related U.S. Application Data filed on Apr. 12, 2021, provisional application No. 63/169,741, filed on Apr. 1, 2021.

(51) Int. Cl.
  *H10K 59/131* (2023.01)
  *H10K 59/35* (2023.01)

(52) U.S. Cl.
  CPC ............... *G09G 2300/0452* (2013.01); *G09G 2340/0407* (2013.01); *G09G 2354/00* (2013.01); *H10K 59/353* (2023.02)

(58) Field of Classification Search
  CPC .. H10K 59/60; H10K 59/65; H10K 59/80515; H10K 59/80521; H10K 59/35–353; H10K 59/84; H10K 59/86; H10K 59/12–129; H10K 59/13–1315; H10K 59/353; G09G 3/3208; G09G 2300/0421; G09G 2300/0426; G09G 2300/0465; G09G 2354/00; G09G 2300/0804; G09G 2300/0407; G09G 2300/0439–0452; G09G 2340/04–0407; G09G 2340/0407; G09G 2300/0452; G06F 3/0412; G06F 3/0425; G02B 27/00–648; G02B 2027/0105–0198

See application file for complete search history.

(56) References Cited

U.S. PATENT DOCUMENTS

| | | | |
|---|---|---|---|
| 7,940,457 B2 | 5/2011 | Jain et al. | |
| 8,531,118 B2 | 9/2013 | Miskin et al. | |
| 8,724,942 B2 | 5/2014 | Logunov et al. | |
| 9,098,136 B2 | 8/2015 | Kim | |
| 10,268,884 B2 | 4/2019 | Jones et al. | |
| 2007/0216610 A1* | 9/2007 | Smith | H10K 59/353 345/76 |
| 2014/0375704 A1 | 12/2014 | Bi et al. | |
| 2015/0241705 A1 | 8/2015 | Abovitz et al. | |
| 2016/0043148 A1* | 2/2016 | Wu | H10K 59/352 257/89 |
| 2017/0116934 A1 | 4/2017 | Tien et al. | |
| 2018/0165533 A1* | 6/2018 | Cho | G09G 5/003 |
| 2019/0041658 A1 | 2/2019 | Gollier et al. | |
| 2019/0094541 A1 | 3/2019 | Choi et al. | |
| 2020/0019747 A1* | 1/2020 | Yang | H10K 59/121 |
| 2021/0217821 A1* | 7/2021 | Han | H10K 71/166 |
| 2022/0173170 A1* | 6/2022 | Yang | G09G 3/3216 |
| 2022/0310760 A1* | 9/2022 | Park | H10K 59/1213 |
| 2022/0376029 A1* | 11/2022 | Huang | H10K 59/121 |
| 2023/0117888 A1* | 4/2023 | Du | G09G 3/2003 345/55 |
| 2023/0422552 A1* | 12/2023 | Huang | H10K 59/123 |

* cited by examiner

DEVICES WITH DISPLAYS HAVING TRANSPARENT OPENINGS AND SHORTED PIXELS

This application claims the benefit of provisional patent application No. 63/169,741, filed Apr. 1, 2021, provisional patent application No. 63/173,981, filed Apr. 12, 2021, and provisional patent application No. 63/256,438, filed Oct. 15, 2021, which are hereby incorporated by reference herein in their entireties.

BACKGROUND

This relates generally to electronic devices, and, more particularly, to electronic devices with displays.

Electronic devices often include displays. For example, an electronic device may have an organic light-emitting diode (OLED) display based on organic light-emitting diode pixels. In this type of display, each pixel includes a light-emitting diode and thin-film transistors for controlling application of a signal to the light-emitting diode to produce light. The light-emitting diodes may include OLED layers positioned between an anode and a cathode.

There is a trend towards borderless electronic devices with a full-face display. These devices, however, may still need to include sensors such as cameras, ambient light sensors, and proximity sensors to provide other device capabilities. Since the display now covers the entire front face of the electronic device, the sensors will have to be placed under the display stack. In practice, however, the amount of light transmission through the display stack is very low (i.e., the transmission might be less than 20% in the visible spectrum), which severely limits the sensing performance under the display.

It is within this context that the embodiments herein arise.

SUMMARY

An electronic device may include a display and an optical sensor formed underneath the display. The display may have both a full pixel density region and a partial pixel density region (sometimes referred to as a pixel removal region or high-transmittance region). The pixel removal region includes a plurality of high-transmittance areas that overlap the optical sensor. Each high-transmittance area may be devoid of thin-film transistors and other display components. The plurality of high-transmittance areas regions is configured to increase the transmittance of light through the display to the sensor. The high-transmittance areas may therefore be referred to as transparent windows in the display.

To further increase the transmittance of light through the display, emissive sub-pixels in the pixel removal region may be shorted together. Each emissive sub-pixel may be shorted to an emissive sub-pixel of the same color. This allows for an additional 50% reduction in thin-film transistor sub-pixels in the pixel removal region of the display. Shorting paths may be included to electrically connect the anodes of the shorted emissive sub-pixels.

The thin-film transistor sub-pixels may be arranged in a repeating pattern across the pixel removal region. Alternatively, the thin-film transistor sub-pixels may be consolidated horizontally and/or vertically to produce larger continuous high-transmittance areas. An emissive sub-pixel may be shorted to a corresponding emissive sub-pixel in the same row and a different column, the same column and a different row, or a different row and a different column.

DETAILED DESCRIPTION

Figure 1:
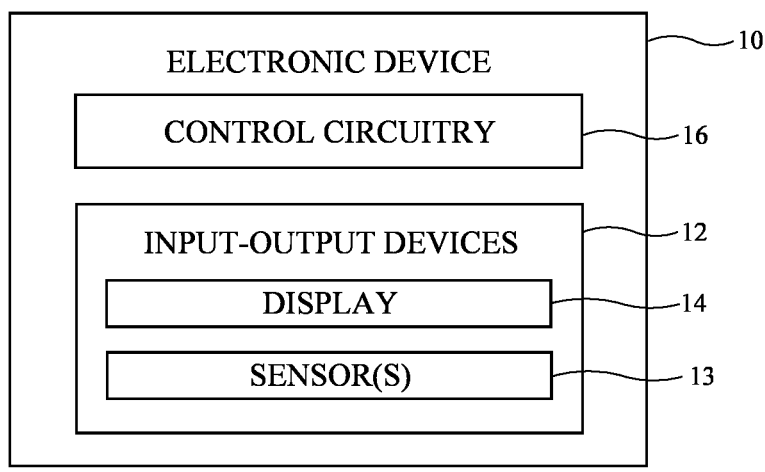
FIG. 1 is a schematic diagram of an illustrative electronic device having a display and one or more sensors in accordance with an embodiment.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a display, a computer display that contains an embedded computer, a computer display that does not contain an embedded computer, a gaming device, a navigation device, an embedded system such as a system in which electronic equipment with a display is mounted in a kiosk or automobile, or other electronic equipment. Electronic device 10 may have the shape of a pair of eyeglasses (e.g., supporting frames), may form a housing having a helmet shape, or may have other configurations to help in mounting and securing the components of one or more displays on the head or near the eye of a user.

As shown in FIG. 1, electronic device 10 may include control circuitry 16 for supporting the operation of device 10. Control circuitry 16 may include storage such as hard disk drive storage, nonvolatile memory (e.g., flash memory or other electrically-programmable-read-only memory configured to form a solid-state drive), volatile memory (e.g., static or dynamic random-access memory), etc. Processing circuitry in control circuitry 16 may be used to control the operation of device 10. The processing circuitry may be based on one or more microprocessors, microcontrollers, digital signal processors, baseband processors, power management units, audio chips, application-specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input resources of input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. A touch sensor for display 14 may be formed from electrodes formed on a common display substrate with the display pixels of display 14 or may be formed from a separate touch sensor panel that overlaps the pixels of display 14. If desired, display 14 may be insensitive to touch (i.e., the touch sensor may be omitted). Display 14 in electronic device 10 may be a head-up display that can be viewed without requiring users to look away from a typical viewpoint or may be a head-mounted display that is incorporated into a device that is worn on a user's head. If desired, display 14 may also be a holographic display used to display holograms.

Control circuitry 16 may be used to run software on device 10 such as operating system code and applications. During operation of device 10, the software running on control circuitry 16 may display images on display 14.

Input-output devices 12 may also include one or more sensors 13 such as force sensors (e.g., strain gauges, capacitive force sensors, resistive force sensors, etc.), audio sensors such as microphones, touch and/or proximity sensors such as capacitive sensors (e.g., a two-dimensional capacitive touch sensor associated with a display and/or a touch sensor that forms a button, trackpad, or other input device not associated with a display), and other sensors. In accordance with some embodiments, sensors 13 may include optical sensors such as optical sensors that emit and detect light (e.g., optical proximity sensors such as transreflective optical proximity structures), ultrasonic sensors, and/or other touch and/or proximity sensors, monochromatic and color ambient light sensors, image sensors, fingerprint sensors, temperature sensors, proximity sensors and other sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors, depth sensors (e.g., structured light sensors and/or depth sensors based on stereo imaging devices), optical sensors such as self-mixing sensors and light detection and ranging (lidar) sensors that gather time-of-flight measurements, humidity sensors, moisture sensors, gaze tracking sensors, and/or other sensors. In some arrangements, device 10 may use sensors 13 and/or other input-output devices to gather user input (e.g., buttons may be used to gather button press input, touch sensors overlapping displays can be used for gathering user touch screen input, touch pads may be used in gathering touch input, microphones may be used for gathering audio input, accelerometers may be used in monitoring when a finger contacts an input surface and may therefore be used to gather finger press input, etc.).

Display 14 may be an organic light-emitting diode display or may be a display based on other types of display technology (e.g., liquid crystal displays). Device configurations in which display 14 is an organic light-emitting diode display are sometimes described herein as an example. This is, however, merely illustrative. Any suitable type of display may be used, if desired. In general, display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 2:
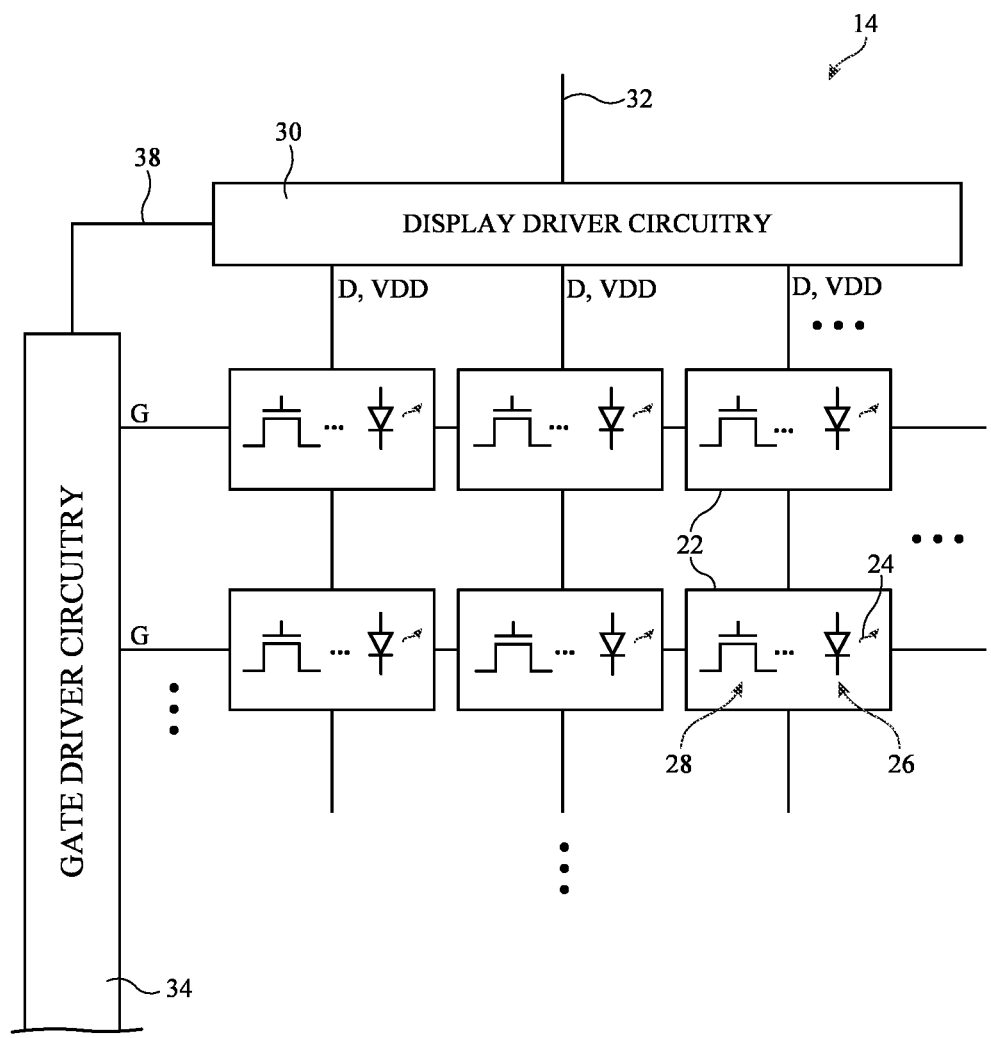
FIG. 2 is a schematic diagram of an illustrative display with light-emitting elements in accordance with an embodiment.

A top view of a portion of display 14 is shown in FIG. 2. As shown in FIG. 2, display 14 may have an array of pixels 22 formed on a substrate. Pixels 22 may receive data signals over signal paths such as data lines D and may receive one or more control signals over control signal paths such as horizontal control lines G (sometimes referred to as gate lines, scan lines, emission control lines, etc.). There may be any suitable number of rows and columns of pixels 22 in display 14 (e.g., tens or more, hundreds or more, or thousands or more). Each pixel 22 may include a light-emitting diode 26 that emits light 24 under the control of a pixel control circuit formed from thin-film transistor circuitry such as thin-film transistors 28 and thin-film capacitors. Thin-film transistors 28 may be polysilicon thin-film transistors, semiconducting-oxide thin-film transistors such as indium zinc gallium oxide (IGZO) transistors, or thin-film transistors formed from other semiconductors. Pixels 22 may contain light-emitting diodes of different colors (e.g., red, green, and blue) to provide display 14 with the ability to display color images or may be monochromatic pixels.

Display driver circuitry may be used to control the operation of pixels 22. The display driver circuitry may be formed from integrated circuits, thin-film transistor circuits, or other suitable circuitry. Display driver circuitry 30 of FIG. 2 may contain communications circuitry for communicating with system control circuitry such as control circuitry 16 of FIG. 1 over path 32. Path 32 may be formed from traces on a flexible printed circuit or other cable. During operation, the control circuitry (e.g., control circuitry 16 of FIG. 1) may supply display driver circuitry 30 with information on images to be displayed on display 14.

To display the images on display pixels 22, display driver circuitry 30 may supply image data to data lines D while issuing clock signals and other control signals to supporting display driver circuitry such as gate driver circuitry 34 over path 38. If desired, display driver circuitry 30 may also supply clock signals and other control signals to gate driver circuitry 34 on an opposing edge of display 14.

Gate driver circuitry 34 (sometimes referred to as row control circuitry) may be implemented as part of an integrated circuit and/or may be implemented using thin-film transistor circuitry. Horizontal control lines G in display 14 may carry gate line signals such as scan line signals, emission enable control signals, and other horizontal control signals for controlling the display pixels 22 of each row. There may be any suitable number of horizontal control signals per row of pixels 22 (e.g., one or more row control signals, two or more row control signals, three or more row control signals, four or more row control signals, etc.).

The region on display 14 where the display pixels 22 are formed may sometimes be referred to herein as the active area. Electronic device 10 has an external housing with a peripheral edge. The region surrounding the active area and within the peripheral edge of device 10 is the border region. Images can only be displayed to a user of the device in the active region. It is generally desirable to minimize the border region of device 10. For example, device 10 may be provided with a full-face display 14 that extends across the entire front face of the device. If desired, display 14 may also wrap around over the edge of the front face so that at least part of the lateral edges or at least part of the back surface of device 10 is used for display purposes.

Figure 3:
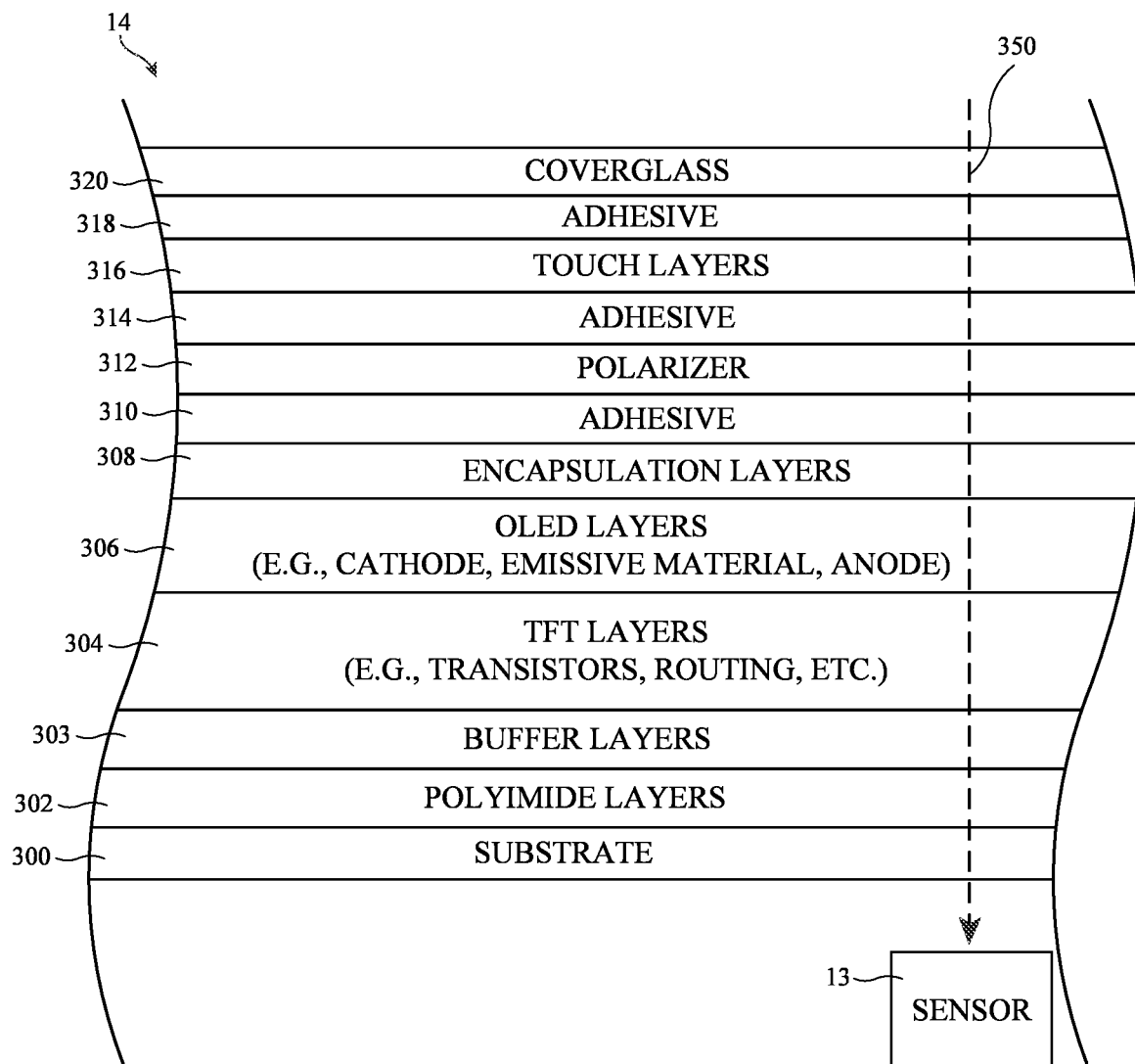
FIG. 3 is a cross-sectional side view of an illustrative display stack that at least partially covers a sensor in accordance with an embodiment.

Device 10 may include a sensor 13 mounted behind display 14 (e.g., behind the active area of the display). FIG. 3 is a cross-sectional side view of an illustrative display stack of display 14 that at least partially covers a sensor in accordance with an embodiment. As shown in FIG. 3, the display stack may include a substrate such as substrate 300. Substrate 300 may be formed from glass, metal, plastic, ceramic, sapphire, or other suitable substrate materials. In some arrangements, substrate 300 may be an organic substrate formed from polyethylene terephthalate (PET) or polyethylene naphthalate (PEN) (as examples). One or more polyimide (PI) layers 302 may be formed over substrate 300. The polyimide layers may sometimes be referred to as an organic substrate (e.g., substrate 300 is a first substrate layer and substrate 302 is a second substrate layer). The surface of substrate 302 may optionally be covered with one or more buffer layers 303 (e.g., inorganic buffer layers such as layers of silicon oxide, silicon nitride, amorphous silicon, etc.).

Thin-film transistor (TFT) layers 304 may be formed over inorganic buffer layers 303 and organic substrates 302 and 300. The TFT layers 304 may include thin-film transistor circuitry such as thin-film transistors, thin-film capacitors, associated routing circuitry, and other thin-film structures formed within multiple metal routing layers and dielectric layers. Organic light-emitting diode (OLED) layers 306 may be formed over the TFT layers 304. The OLED layers 306 may include a diode cathode layer, a diode anode layer, and emissive material interposed between the cathode and anode layers. The OLED layers may include a pixel definition layer that defines the light-emitting area of each pixel. The TFT circuitry in layer 304 may be used to control an array of display pixels formed by the OLED layers 306.

Circuitry formed in the TFT layers 304 and the OLED layers 306 may be protected by encapsulation layers 308. As an example, encapsulation layers 308 may include a first inorganic encapsulation layer, an organic encapsulation layer formed on the first inorganic encapsulation layer, and a second inorganic encapsulation layer formed on the organic encapsulation layer. Encapsulation layers 308 formed in this way can help prevent moisture and other potential contaminants from damaging the conductive circuitry that is covered by layers 308. Substrate 300, polyimide layers 302, buffer layers 303, TFT layers 304, OLED layers 306, and encapsulation layers 308 may be collectively referred to as a display panel.

One or more polarizer films 312 may be formed over the encapsulation layers 308 using adhesive 310. Adhesive 310 may be implemented using optically clear adhesive (OCA) material that offer high light transmittance. One or more touch layers 316 that implement the touch sensor functions of touch-screen display 14 may be formed over polarizer films 312 using adhesive 314 (e.g., OCA material). For example, touch layers 316 may include horizontal touch sensor electrodes and vertical touch sensor electrodes collectively forming an array of capacitive touch sensor electrodes. Lastly, the display stack may be topped off with a cover glass layer 320 (sometimes referred to as a display cover layer 320) that is formed over the touch layers 316 using additional adhesive 318 (e.g., OCA material). display cover layer 320 may be a transparent layer (e.g., transparent plastic or glass) that serves as an outer protective layer for display 14. The outer surface of display cover layer 320 may form an exterior surface of the display and the electronic device that includes the display.

Still referring to FIG. 3, sensor 13 may be formed under the display stack within the electronic device 10. As described above in connection with FIG. 1, sensor 13 may be an optical sensor such as a camera, proximity sensor, ambient light sensor, fingerprint sensor, or other light-based sensor. In some cases, sensor 13 may include a light-emitting component that emits light through the display. Sensor 13 may therefore sometimes be referred to as input-output component 13. Input-output component 13 may be a sensor or a light-emitting component (e.g., that is part of a sensor). The performance of input-output component 13 depends on the transmission of light traversing through the display stack, as indicated by arrow 350. A typical display stack, however, has fairly limited transmission properties. For instance, more than 80% of light in the visible and infrared light spectrum might be lost when traveling through the display stack, which makes sensing under display 14 challenging.

Each of the multitude of layers in the display stack contributes to the degraded light transmission to sensor 13. In particular, the dense thin-film transistors and associated routing structures in TFT layers 304 of the display stack contribute substantially to the low transmission. In accordance with an embodiment, at least some of the display pixels may be selectively removed in regions of the display stack located directly over sensor(s) 13. Regions of display 14 that at least partially cover or overlap with sensor(s) 13 in which at least a portion of the display pixels have been removed are sometimes referred to as pixel removal regions or low density pixel regions. Removing display pixels (e.g., removing transistors and/or capacitors associated with one or more sub-pixels) in the pixel removal regions can drastically help increase transmission and improve the performance of the under-display sensor 13. In addition to removing display pixels, portions of additional layers such as polyimide layers 302 and/or substrate 300 may be removed for additional transmission improvement. Polarizer 312 may also be bleached for additional transmission improvement.

Figure 4:
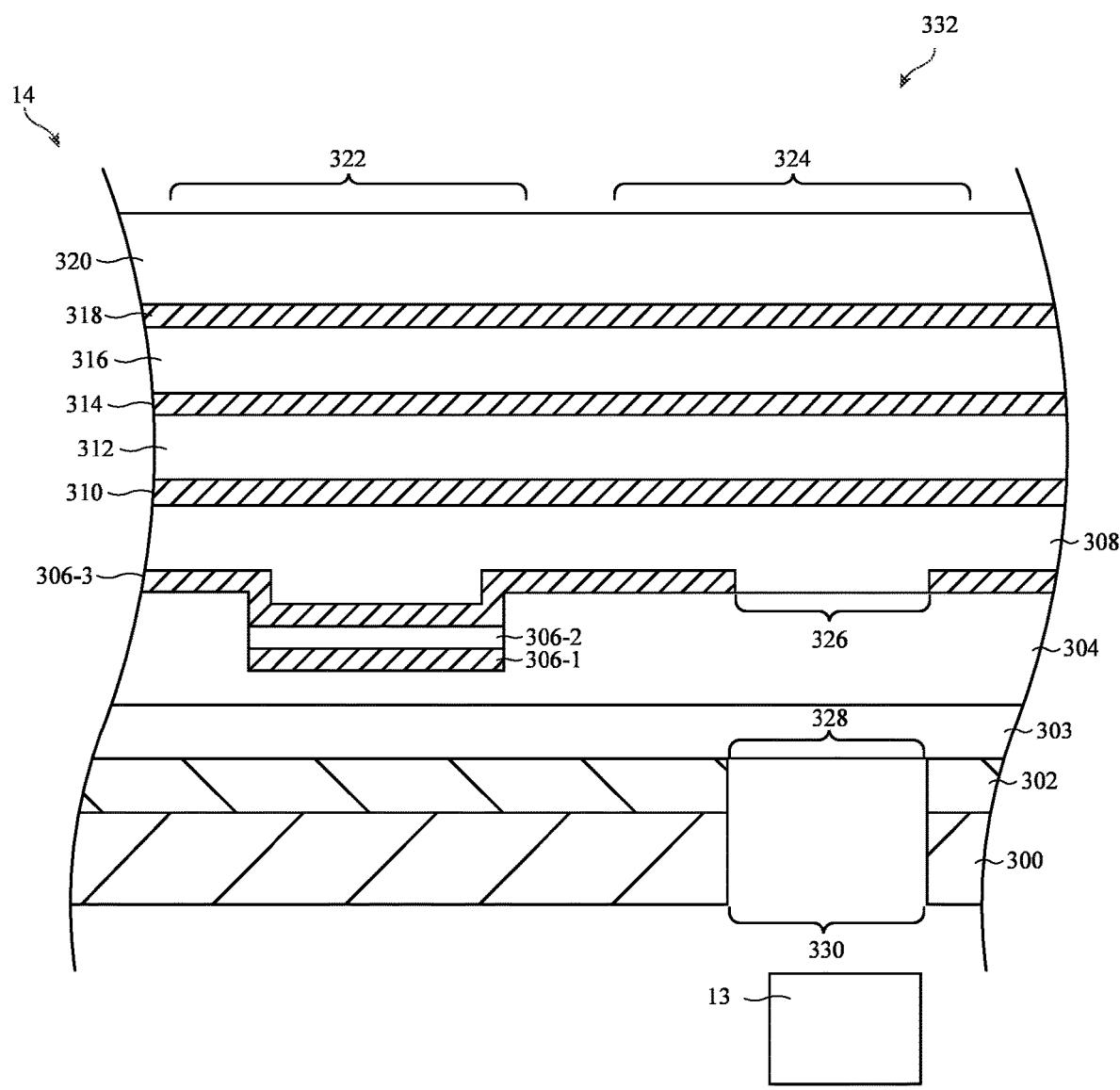
FIG. 4 is a cross-sectional side view of an illustrative display stack with a high-transmittance area that overlaps a sensor in accordance with an embodiment.

FIG. 4 is a cross-sectional side view of an illustrative display showing how pixels may be removed in a pixel removal region 332 to increase transmission through the display. As shown in FIG. 4, display 14 may include a pixel region 322 and a high-transmittance area 324. In the pixel region 322, the display may include a pixel formed from emissive material 306-2 that is interposed between an anode 306-1 and a cathode 306-3. Signals may be selectively applied to anode 306-1 to cause emissive material 306-2 to emit light for the pixel. Circuitry in thin-film transistor layer 304 may be used to control the signals applied to anode 306-1.

In high-transmittance area 324, anode 306-1 and emissive material 306-2 may be omitted. Without the high-transmittance area, an additional pixel may be formed in area 324 adjacent to the pixel in area 322. However, to increase the transmittance of light to sensor 13 under the display, the pixels in area 324 are removed. The absence of emissive material 306-2 and anode 306-1 may increase the transmittance through the display stack. Additional circuitry within thin-film transistor layer 304 may also be omitted in high-transmittance area 324 to increase transmittance.

Additional transmission improvements through the display stack may be obtained by selectively removing additional components from the display stack in high-transmittance area 324. As shown in FIG. 4, a portion of cathode 306-3 may be removed in high-transmittance area 324. This results in an opening 326 in the cathode 306-3. Said another way, the cathode 306-3 may have conductive material that defines an opening 326 in the pixel removal region. Removing the cathode in this way allows for more light to pass through the display stack to sensor 13. Cathode 306-3 may be formed from any desired conductive material. The cathode may be removed via etching (e.g., laser etching or plasma etching). Alternatively, the cathode may be patterned to have an opening in high-transmittance area 324 during the original cathode deposition and formation steps.

Polyimide layers 302 may be removed in high-transmittance area 324 in addition to cathode layer 306-3. The removal of the polyimide layers 302 results in an opening 328 in the pixel removal region. Said another way, the polyimide layer may have polyimide material that defines an opening 328 in the high-transmittance region. The polyimide layers may be removed via etching (e.g., laser etching or plasma etching). Alternatively, the polyimide layers may be patterned to have an opening in high-transmittance area 324 during the original polyimide formation steps. Removing the polyimide layer 302 in high-transmittance area 324 may result in additional transmittance of light to sensor 13 in high-transmittance area 324.

Substrate 300 may be removed in high-transmittance area 324 in addition to cathode layer 306-3 and polyimide layer 302. The removal of the substrate 300 results in an opening 330 in the high-transmittance area. Said another way, the substrate 300 may have material (e.g., PET, PEN, etc.) that defines an opening 330 in the pixel removal region. The substrate may be removed via etching (e.g., with a laser). Alternatively, the substrate may be patterned to have an opening in high-transmittance area 324 during the original substrate formation steps. Removing the substrate 300 in high-transmittance area 324 may result in additional transmittance of light in high-transmittance area 324. The polyimide opening 328 and substrate opening 330 may be considered to form a single unitary opening. When removing portions of polyimide layer 302 and/or substrate 300, inorganic buffer layers 303 may serve as an etch stop for the etching step. Openings 328 and 330 may be filled with air or another desired transparent filler.

In addition to having openings in cathode 306-3, polyimide layers 302, and/or substrate 300, the polarizer 312 in the display may be bleached for additional transmittance in the pixel removal region.

Figure 5:
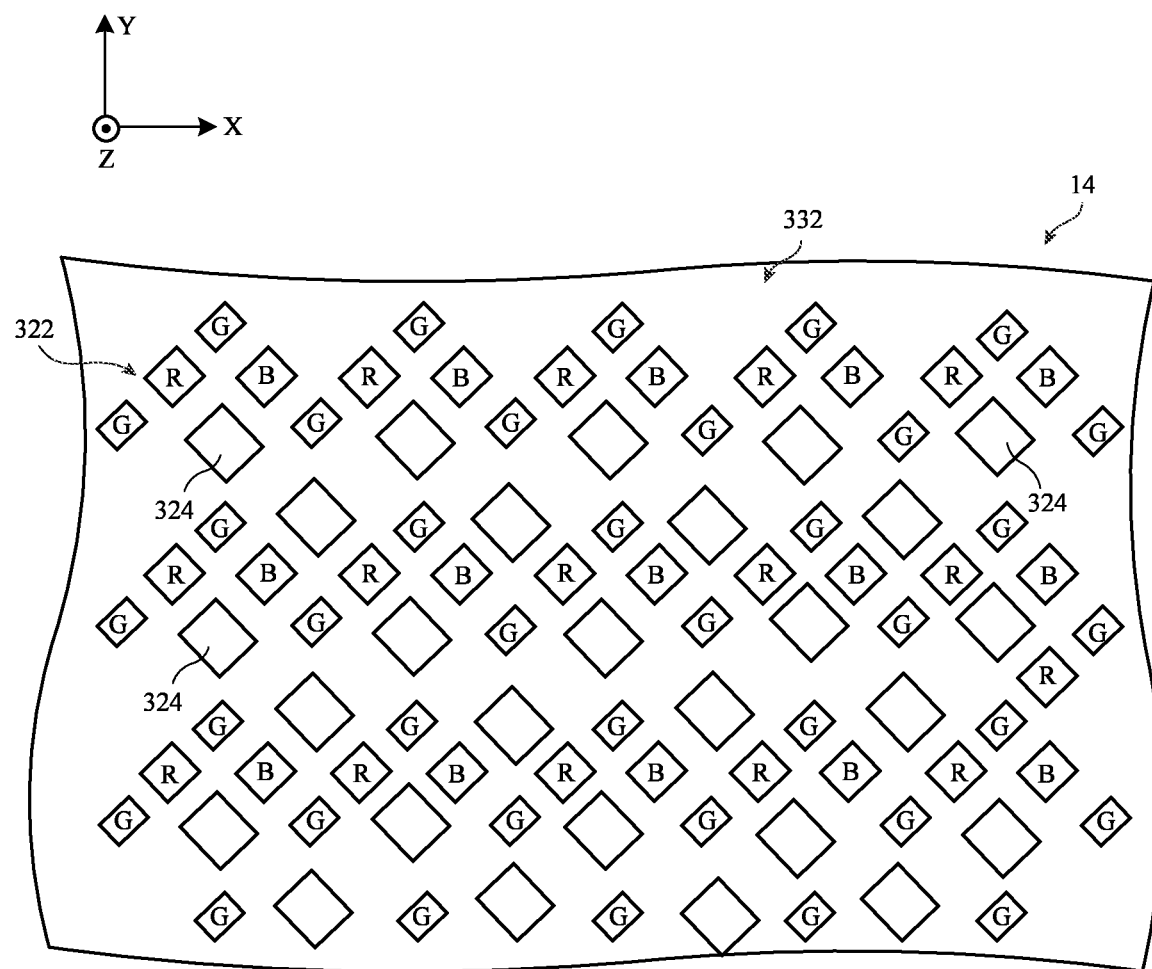
FIG. 5 is a top view of an illustrative display with transparent openings that overlap a sensor in accordance with an embodiment.

FIG. 5 is a top view of an illustrative display showing how high-transmittance areas may be incorporated into a pixel removal region 332 of the display. As shown, the display may include a plurality of pixels. In FIG. 5, there are a plurality of red pixels (R), a plurality of blue pixels (B), and a plurality of green pixels (G). The red, blue, and green pixels may be arranged in any desired pattern. Different nomenclature may be used to refer to the red, green, and blue pixels in the display. As one option, the red, blue, and green pixels may be referred to simply as pixels. As another option, the red, blue, and green pixels may instead be referred to as red, blue, and green sub-pixels. In this example, a group of sub-pixels of different colors may be referred to as pixel. In high-transmittance areas 324, no sub-pixels are included in the display (even though sub-pixels would normally be present if the normal sub-pixel pattern was followed).

To provide a uniform distribution of sub-pixels across the display surface, an intelligent pixel removal process may be implemented that systematically eliminates the closest sub-pixel of the same color (e.g., the nearest neighbor of the same color may be removed). The pixel removal process may involve, for each color, selecting a given sub-pixel, identifying the closest or nearest neighboring sub-pixels of the same color (in terms of distance from the selected sub-pixel), and then eliminating/omitting those identified sub-pixels in the final pixel removal region. With this type of arrangement, there may be high-transmittance areas in the pixel removal region, allowing a sensor or light-emitting component to operate through the display in the pixel removal region. Additionally, because some of the pixels remain present in the pixel removal region (e.g., 50% of the pixels in the layout of FIG. 5), the pixel removal region may not have a perceptibly different appearance from the rest of the display for a viewer.

As shown in FIG. 5, display 14 may include an array of high-transmittance areas 324. Each high-transmittance area 324 may have pixels removed in that area. Each high-transmittance area also has an increased transparency compared to pixel region 322. The high-transmittance areas 324 may sometimes be referred to as transparent windows 324, transparent display windows 324, transparent openings 324, transparent display openings 324, etc. The transparent display windows may allow for light to be transmitted through the display to an underlying sensor or for light to be transmitted through the display from a light source underneath the display. The transparency of transparent openings 324 (for visible and/or infrared light) may be greater than 25%, greater than 30%, greater than 40%, greater than 50%, greater than 60%, greater than 70%, greater than 80%, greater than 90%, etc. The transparency of transparent openings 324 may be greater than the transparency of pixel region 322. The transparency of pixel region 322 may be less than 25%, less than 20%, less than 10%, less than 5%, etc. The pixel region 322 may sometimes be referred to as opaque display region 322, opaque region 322, opaque footprint 322, etc. Opaque region 322 includes light emitting pixels R, G, and B, and blocks light from passing through the display.

The pattern of pixels (322) and high-transmittance areas (324) in FIG. 5 is merely illustrative. In FIG. 5, discrete high-transmittance areas 324 are depicted. However, it should be understood that these high-transmittance areas may form larger, unitary transparent openings if desired.

The pattern of sub-pixels and pixel removal regions in FIG. 5 is merely illustrative. In FIG. 5, the display edge may be parallel to the X axis or the Y axis. The front face of the display may be parallel to the XY plane such that a user of the device views the front face of the display in the Z direction. In FIG. 5, every other sub-pixel may be removed for each color. The resulting pixel configuration has 50% of the sub-pixels removed. In FIG. 5, the remaining pixels follow a zig-zag pattern across the display (with two green sub-pixels for every one red or blue sub-pixel). In FIG. 5, the sub-pixels have edges angled relative to the edges of the display (e.g., the edges of the sub-pixels are at non-zero, non-orthogonal angles relative to the X-axis and Y-axis). This example is merely illustrative. If desired, each individual sub-pixel may have edges parallel to the display edge, a different proportion of pixels may be removed for different colors, the remaining pixels may follow a different pattern, etc.

Figure 6A:
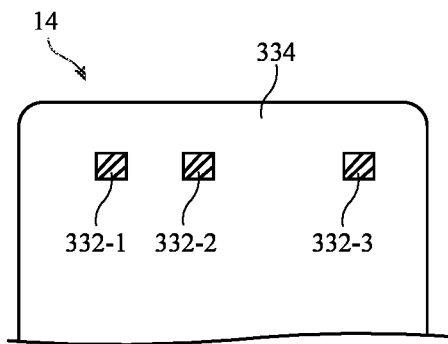
FIGS. 6A-6F are top views of illustrative displays showing possible positions for pixel removal regions in accordance with an embodiment.

In general, the display sub-pixels may be partially removed from any region(s) of display 14. FIGS. 6A-6F are front views showing how display 14 may have one or more localized pixel removal regions in which the sub-pixels are selectively removed. The example of FIG. 6A illustrates various local pixel removal regions 332 physically separated from one another (i.e., the various pixel removal regions 332 are non-continuous) by full pixel density region 334. The full pixel density region 334 (sometimes referred to as full pixel density area 334) does not include any transparent windows 324 (e.g., none of the sub-pixels are removed and the display follows the pixel pattern without modifications). The three pixel removal regions 332-1, 332-2, and 332-3 in FIG. 6A might for example correspond to three different sensors formed underneath display 14 (with one sensor per pixel removal region).

Figure 6B:
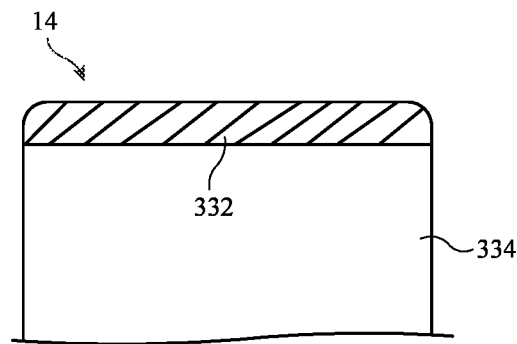
Figure 6C:
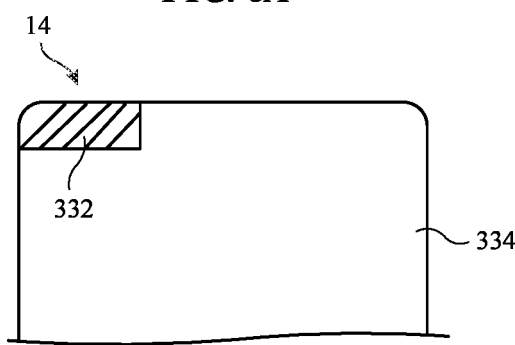
Figure 6D:
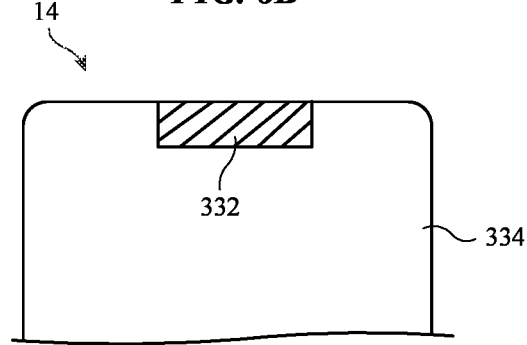
Figure 6E:
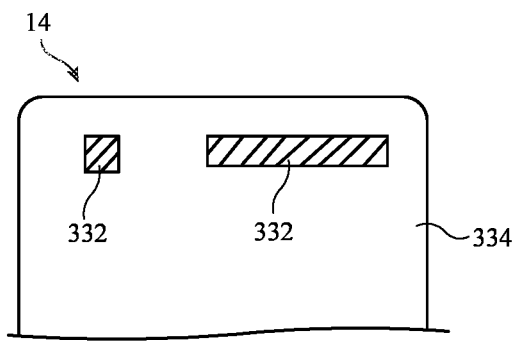
Figure 6F:
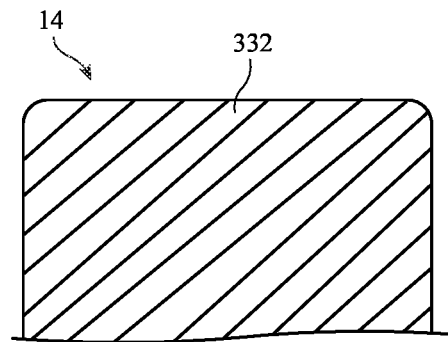

The example of FIG. 6B illustrates a continuous pixel removal region 332 formed along the top border of display 14, which might be suitable when there are many optical sensors positioned near the top edge of device 10. The example of FIG. 6C illustrates a pixel removal region 332 formed at a corner of display 14 (e.g., a rounded corner area of the display). In some arrangements, the corner of display 14 in which pixel removal region 332 is located may be a rounded corner (as in FIG. 6C) or a corner having a substantially 90° corner. The example of FIG. 6D illustrates a pixel removal region 332 formed only in the center portion along the top edge of device 10 (i.e., the pixel removal region covers a recessed notch area in the display). FIG. 6E illustrates another example in which pixel removal regions 332 can have different shapes and sizes. FIG. 6F illustrates yet another suitable example in which the pixel removal region covers the entire display surface. These examples are merely illustrative and are not intended to limit the scope of the present embodiments. If desired, any one or more portions of the display overlapping with optically based sensors or other sub-display electrical components may be designated as a pixel removal region/area.

The purpose of removing the pixels from pixel removal region 332 is to increase the transmittance of light through the display in region 332. Therefore, regions 332 may sometimes be referred to as high-transmittance regions of the display. In some cases, pixels may be reduced in size in region 332 relative to region 334 to increase the transmittance in region 332 (without removing pixels).

FIG. 5 shows an example of a pixel removal region where some sub-pixels are removed in favor of transparent openings in the display. FIG. 5 shows a layout for sub-pixels within the pixel removal region. It should be noted that these layouts are for the emissive layer of each sub-pixel.

Each display pixel 22 may include both a thin-film transistor layer and an emissive layer. Each emissive layer portion may have associated circuitry on the thin-film transistor layer that controls the magnitude of light emitted from that emissive layer portion. Both the emissive layer and thin-film transistor layer may have corresponding sub-pixels within the pixel. Each sub-pixel may be associated with a different color of light (e.g., red, green, and blue). The emissive layer portion for a given sub-pixel does not necessarily need to have the same footprint as its associated thin-film transistor layer portion. Hereinafter, the term sub-pixel may sometimes be used to refer to the combination of an emissive layer portion and a thin-film transistor layer portion. Additionally, the thin-film transistor layer may be referred to as having thin-film transistor sub-pixels (e.g., a portion of the thin-film transistor layer that controls a respective emissive area, sometimes referred to as thin-film transistor layer pixels, thin-film transistor layer sub-pixels or simply sub-pixels) and the emissive layer may be referred to as having emissive layer sub-pixels (sometimes referred to as emissive pixels, emissive sub-pixels or simply sub-pixels).

Figure 8:
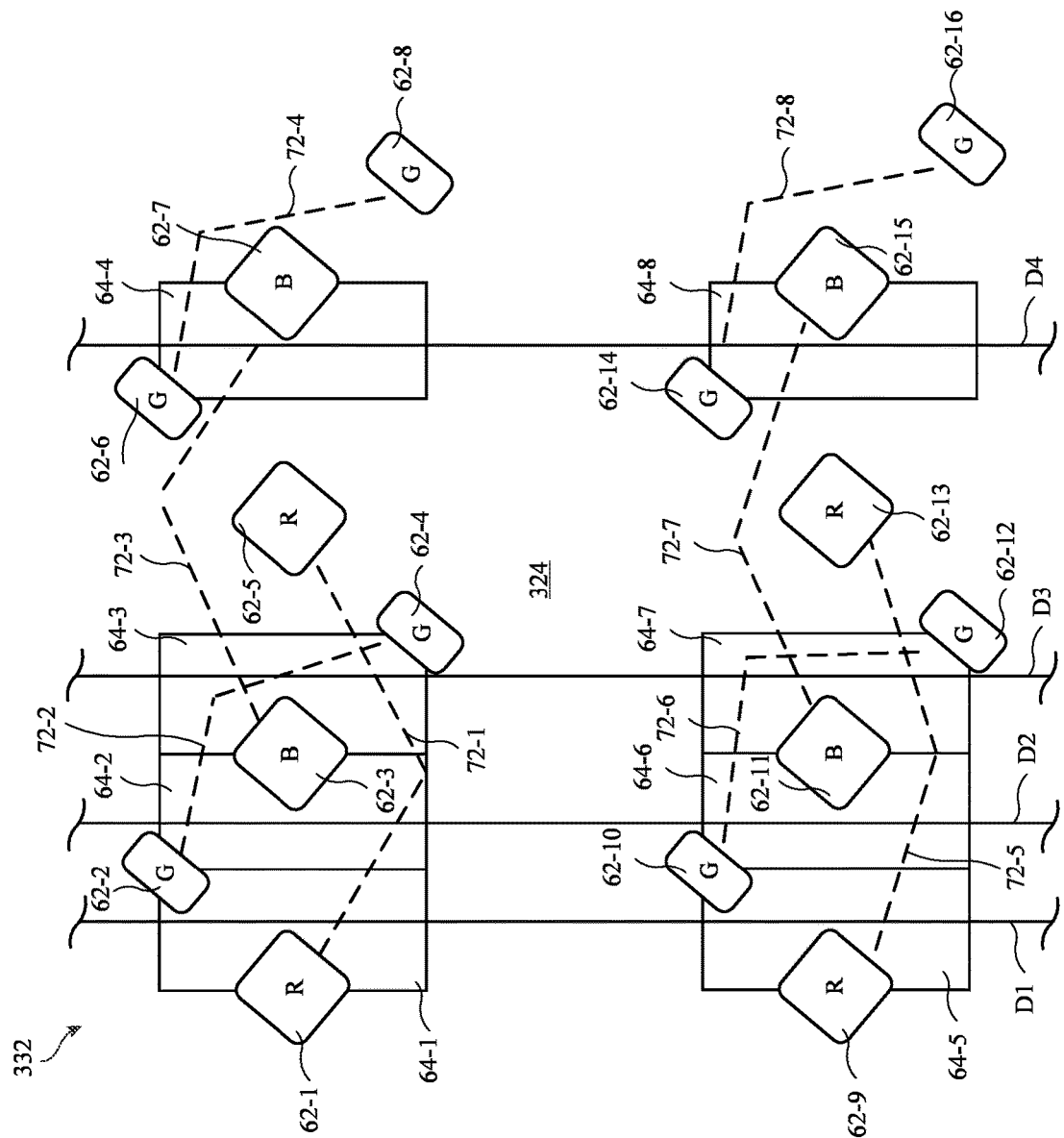
FIG. 8 is a top view of an illustrative pixel removal region in a display that has one thin-film transistor sub-pixel for every two emissive sub-pixels and rows that have the same shorting patterns in accordance with an embodiment.
Figure 9:
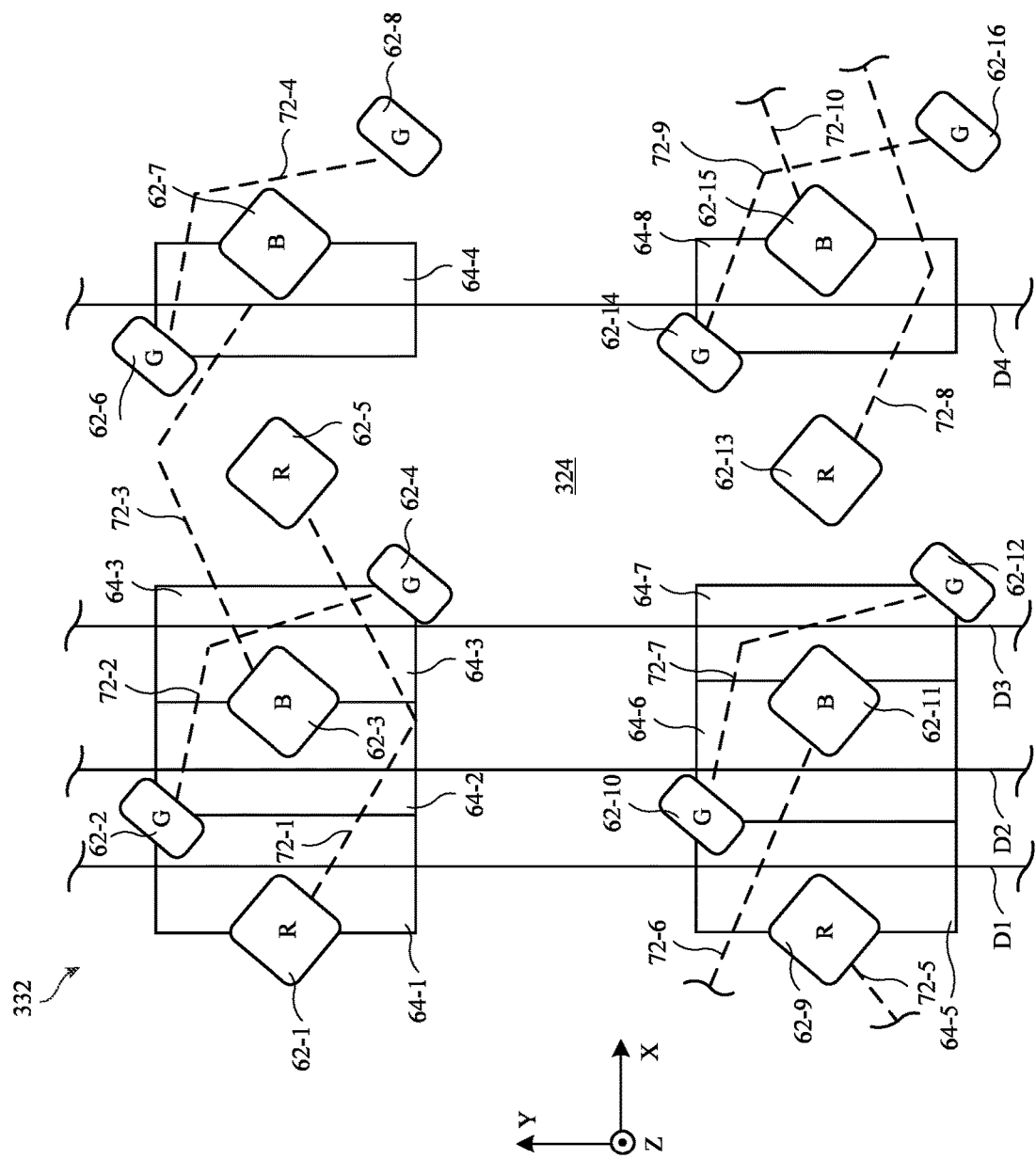
FIG. 9 is a top view of an illustrative pixel removal region in a display that has one thin-film transistor sub-pixel for every two emissive sub-pixels and rows that have some offset shorting patterns in accordance with an embodiment.

Different arrangements may be used for the thin-film transistor sub-pixels and the emissive sub-pixels. FIG. 5 shows an example where the emissive sub-pixels have a horizontal zig-zag arrangement. This emissive sub-pixel arrangement may have multiple possible associated thin-film transistor sub-pixel arrangements, as shown in FIGS. 7-9.

Figure 7:
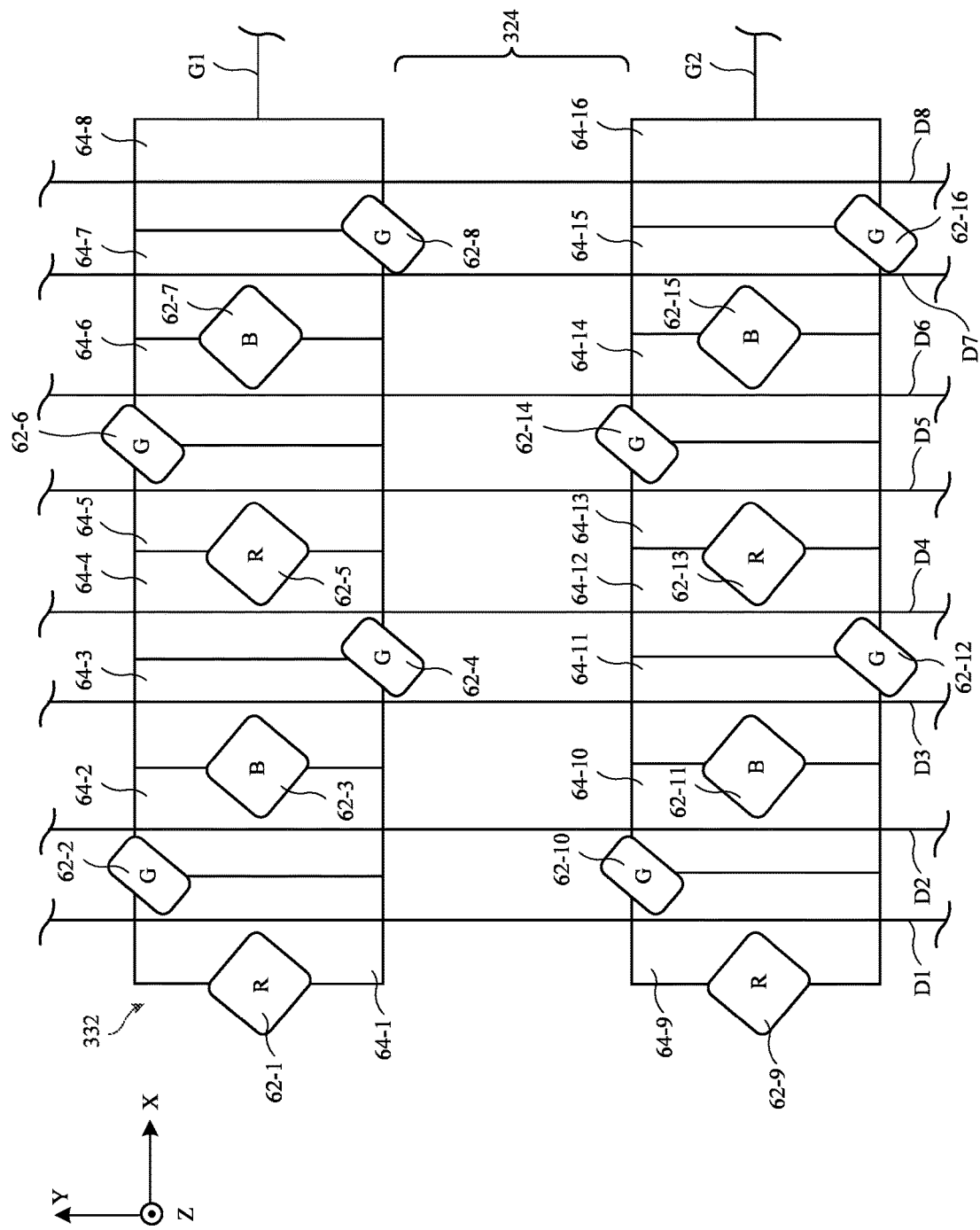
FIG. 7 is a top view of an illustrative pixel removal region in a display that has one thin-film transistor sub-pixel for each emissive sub-pixel in accordance with an embodiment.

As shown in FIG. 7, the pixel removal region 332 may include emissive sub-pixels 62 such as red (R), green (G), and blue (B) emissive sub-pixels 62. The emissive sub-pixels 62 have the same arrangement as shown in FIG. 5 (e.g., horizontal zig-zag arrangement). Each emissive sub-pixel has a corresponding thin-film transistor sub-pixel. As shown in FIG. 6, red emissive sub-pixel 62-1 is controlled by a corresponding thin-film transistor sub-pixel 64-1, green emissive sub-pixel 62-2 is controlled by a corresponding thin-film transistor sub-pixel 64-2, blue emissive sub-pixel 62-3 is controlled by a corresponding thin-film transistor sub-pixel 64-3, green emissive sub-pixel 62-4 is controlled by a corresponding thin-film transistor sub-pixel 64-4, red emissive sub-pixel 62-5 is controlled by a corresponding thin-film transistor sub-pixel 64-5, green emissive sub-pixel 62-6 is controlled by a corresponding thin-film transistor sub-pixel 64-6, blue emissive sub-pixel 62-7 is controlled by a corresponding thin-film transistor sub-pixel 64-7, green emissive sub-pixel 62-8 is controlled by a corresponding thin-film transistor sub-pixel 64-8, red emissive sub-pixel 62-9 is controlled by a corresponding thin-film transistor sub-pixel 64-9, green emissive sub-pixel 62-10 is controlled by a corresponding thin-film transistor sub-pixel 64-10, blue emissive sub-pixel 62-11 is controlled by a corresponding thin-film transistor sub-pixel 64-11, green emissive sub-pixel 62-12 is controlled by a corresponding thin-film transistor sub-pixel 64-12, red emissive sub-pixel 62-13 is controlled by a corresponding thin-film transistor sub-pixel 64-13, green emissive sub-pixel 62-14 is controlled by a corresponding thin-film transistor sub-pixel 64-14, blue emissive sub-pixel 62-15 is controlled by a corresponding thin-film transistor sub-pixel 64-15, and green emissive sub-pixel 62-16 is controlled by a corresponding thin-film transistor sub-pixel 64-16. Each thin-film transistor sub-pixel controls the magnitude of light emitted from its corresponding emissive sub-pixel.

Each column of thin-film transistor sub-pixels is coupled to a respective data line. As shown in FIG. 7, data line D1 provides data to thin-film transistor sub-pixels 64-1 and 64-9, data line D2 provides data to thin-film transistor sub-pixels 64-2 and 64-10, data line D3 provides data to thin-film transistor sub-pixels 64-3 and 64-11, data line D4 provides data to thin-film transistor sub-pixels 64-4 and 64-12, data line D5 provides data to thin-film transistor sub-pixels 64-5 and 64-13, data line D6 provides data to thin-film transistor sub-pixels 64-6 and 64-14, data line D7 provides data to thin-film transistor sub-pixels 64-7 and 64-15, and data line D8 provides data to thin-film transistor sub-pixels 64-8 and 64-16.

In general, thin-film transistor sub-pixels 64 and emissive areas 62 may both have a low transmittance of light through the display stack. The areas between thin-film transistor sub-pixels 64 and emissive areas 62, however, may have a relatively high transmittance of light through the display stack. With the arrangement of FIG. 7, where each emissive sub-pixel has a corresponding thin-film transistor sub-pixel, there may be a high transmittance area 324 between rows of the thin-film transistor sub-pixels. Each row of thin-film transistor sub-pixels may be coupled to one or more corresponding gate lines. FIG. 7 shows an example where the first row of thin-film transistor sub-pixels (with sub-pixels 64-1 through 64-8) is coupled to gate line G1 and the second row of thin-film transistor sub-pixels (with sub-pixels 64-9 through 64-16) is coupled to gate line G2. Additional gate lines may be included for each row if desired.

In the arrangement of FIG. 7, pixel removal region 332 includes 50% of the emissive sub-pixels 62 relative to the full density pixel region 334. Additionally, there are 50% of the thin-film transistor sub-pixels 64 in pixel removal region 332 relative to the full density pixel region 334. In FIG. 7, each emissive sub-pixel 62 has a corresponding dedicated thin-film transistor sub-pixel 64. This is similar to the full pixel density region 334, where each thin-film transistor sub-pixel controls only one corresponding emissive sub-pixel.

In order to increase the transmission of light through pixel removal region 332 without reducing the light-emitting area of the display in pixel removal region 332, additional thin-film transistor sub-pixels 64 may be removed from pixel removal region 332. For example, each thin-film transistor sub-pixel may control the light emitted from two emissive sub-pixels (e.g., that are shorted together). This reduces the number of thin-film transistor sub-pixels by an additional 50% relative to the arrangement of FIG. 7. In total, when each thin-film transistor sub-pixel in the pixel removal region controls two emissive sub-pixels, the pixel removal region 332 may have 50% of the emissive sub-pixels and 25% of the thin-film transistor sub-pixels relative to the full pixel density region 334.

FIG. 8 is a top view of a pixel removal region where each thin-film transistor sub-pixel controls two respective emissive sub-pixels. As shown in FIG. 8, red emissive sub-pixel 62-1 is shorted to red emissive sub-pixel 62-5 by shorting path 72-1 and thin-film transistor sub-pixel 64-1 controls the magnitude of light emitted by both emissive sub-pixels 62-1 and 62-5. Green emissive sub-pixel 62-2 is shorted to green emissive sub-pixel 62-4 by shorting path 72-2 and thin-film transistor sub-pixel 64-2 controls the magnitude of light emitted by both emissive sub-pixels 62-2 and 62-4. Blue emissive sub-pixel 62-3 is shorted to blue emissive sub-pixel 62-7 by shorting path 72-3 and thin-film transistor sub-pixel 64-3 controls the magnitude of light emitted by both emissive sub-pixels 62-3 and 62-7. Green emissive sub-pixel 62-6 is shorted to green emissive sub-pixel 62-8 by shorting path 72-4 and thin-film transistor sub-pixel 64-4 controls the magnitude of light emitted by both emissive sub-pixels 62-6 and 62-8. Red emissive sub-pixel 62-9 is shorted to red emissive sub-pixel 62-13 by shorting path 72-5 and thin-film transistor sub-pixel 64-5 controls the magnitude of light emitted by both emissive sub-pixels 62-9 and 62-13. Green emissive sub-pixel 62-10 is shorted to green emissive sub-pixel 62-12 by shorting path 72-6 and thin-film transistor sub-pixel 64-6 controls the magnitude of light emitted by both emissive sub-pixels 62-10 and 62-12. Blue emissive sub-pixel 62-11 is shorted to blue emissive sub-pixel 62-15 by shorting path 72-7 and thin-film transistor sub-pixel 64-7 controls the magnitude of light emitted by both emissive sub-pixels 62-11 and 62-15. Green emissive sub-pixel 62-14 is shorted to green emissive sub-pixel 62-16 by shorting path 72-8 and thin-film transistor sub-pixel 64-8 controls the magnitude of light emitted by both emissive sub-pixels 62-14 and 62-16.

Each column of thin-film transistor sub-pixels is coupled to a respective data line. As shown in FIG. 8, data line D1 provides data to thin-film transistor sub-pixels 64-1 and 64-5, data line D2 provides data to thin-film transistor sub-pixels 64-2 and 64-6, data line D3 provides data to thin-film transistor sub-pixels 64-3 and 64-7, and data line D4 provides data to thin-film transistor sub-pixels 64-4 and 64-8.

Pixel removal region 332 in FIG. 8 therefore has 50% of the emissive sub-pixels, 25% of the thin-film transistor sub-pixels, and 50% of the data lines compared to a full pixel density region. Pixel removal region 332 in FIG. 8 also has 50% of the thin-film transistor sub-pixels and 50% of the data lines compared to the pixel removal region in FIG. 7. These additional omitted components in the pixel removal region allow for increased transmission through the pixel removal region, thereby improving the performance of the pixel removal region. The pixel removal region in FIG. 8 may have a transmission that is at least 10% greater than the transmission in FIG. 7, at least 20% greater than the transmission in FIG. 7, at least 30% greater than the transmission in FIG. 7, etc. The total transmission of the pixel removal region in FIG. 8 may be greater than 45%, greater than 50%, greater than 55% greater than 60%, between 50% and 60%, etc.

Shorting paths 72 may be formed by conductive routing lines on one or more layers within the display (e.g., within the thin-film transistor circuitry layer in the display). Each shorting path may electrically connect the first anode of a first emissive sub-pixel to the second anode of a second emissive sub-pixel. In this way, when a thin-film transistor sub-pixel applies a drive voltage to the first anode, the drive voltage is also applied to the second anode. Both the first and second emissive sub-pixels therefore emit approximately the same amount of light. This partially reduces the effective resolution of the display in the pixel removal region (since the shorted pixels necessarily emit the same amount of light). However, the display may still have a satisfactory appearance to the viewer in pixel removal region 332 even with the shorted emissive sub-pixels.

In FIG. 8, the pattern of shorted emissive sub-pixels is the same in each row in the pixel removal region. In other words, in both the first row and second row of the pixel removal region, the emissive sub-pixel in the first column is shorted to the emissive sub-pixel in the fifth column, the emissive sub-pixel in the second column is shorted to the emissive sub-pixel in the fourth column, the emissive sub-pixel in the third column is shorted to the emissive sub-pixel in the seventh column, and the emissive sub-pixel in the sixth column is shorted to the emissive sub-pixel in the eighth column. This type of arrangement may be optimal for displaying straight lines in the pixel removal region 332 on the display. However, to instead optimize for displaying curves in pixel removal region 332, the pixel removal region may have offsets between some of the shorted emissive sub-pixels between rows. FIG. 9 is a top view of a pixel removal region having offsets between some of the shorted emissive sub-pixels between rows.

The first row of the pixel removal region in FIG. 9 has a similar arrangement to the first row of the pixel removal region in FIG. 8. As shown in FIG. 9, red emissive sub-pixel 62-1 is shorted to red emissive sub-pixel 62-5 by shorting path 72-1 and thin-film transistor sub-pixel 64-1 controls the magnitude of light emitted by both emissive sub-pixels 62-1 and 62-5. Green emissive sub-pixel 62-2 is shorted to green emissive sub-pixel 62-4 by shorting path 72-2 and thin-film transistor sub-pixel 64-2 controls the magnitude of light emitted by both emissive sub-pixels 62-2 and 62-4. Blue emissive sub-pixel 62-3 is shorted to blue emissive sub-pixel 62-7 by shorting path 72-3 and thin-film transistor sub-pixel 64-3 controls the magnitude of light emitted by both emissive sub-pixels 62-3 and 62-7. Green emissive sub-pixel 62-6 is shorted to green emissive sub-pixel 62-8 by shorting path 72-4 and thin-film transistor sub-pixel 64-4 controls the magnitude of light emitted by both emissive sub-pixels 62-6 and 62-8.

However, the second row of the pixel removal region in FIG. 9 has a different arrangement than the second row of the pixel removal region in FIG. 8. In FIG. 9, red emissive sub-pixel 62-9 is shorted to the adjacent red emissive sub-pixel in the negative X-direction (rather than in the positive X-direction as in the first row) by shorting path 72-5. Thin-film transistor sub-pixel 64-5 controls the magnitude of light emitted by both emissive sub-pixel 62-9 and the adjacent red emissive sub-pixel in the negative X-direction. Green emissive sub-pixel 62-10 is shorted to green emissive sub-pixel 62-12 by shorting path 72-7 and thin-film transistor sub-pixel 64-6 controls the magnitude of light emitted by both emissive sub-pixels 62-10 and 62-12. Blue emissive sub-pixel 62-11 is shorted to the adjacent blue emissive sub-pixel in the negative X-direction (rather than in the positive X-direction as in the first row) by shorting path 72-6. Thin-film transistor sub-pixel 64-7 controls the magnitude of light emitted by both emissive sub-pixel 62-11 and the adjacent blue emissive sub-pixel in the negative X-direction. Red emissive sub-pixel 62-13 is shorted to an adjacent red emissive sub-pixel in the positive X-direction (instead of in the negative X-direction as in FIG. 8) by shorting path 72-8. Red emissive sub-pixel 62-13 may be controlled by the same thin-film transistor sub-pixel as the adjacent red emissive sub-pixel in the positive X-direction. Green emissive sub-pixel 62-14 is shorted to green emissive sub-pixel 62-16 by shorting path 72-9 and thin-film transistor sub-pixel 64-8 controls the magnitude of light emitted by both emissive sub-pixels 62-14 and 62-16. Blue emissive sub-pixel 62-15 is shorted to an adjacent blue emissive sub-pixel in the positive X-direction (instead of in the negative X-direction as in FIG. 8) by shorting path 72-10. Blue emissive sub-pixel 62-15 may be controlled by the same thin-film transistor sub-pixel as the adjacent blue emissive sub-pixel in the positive X-direction.

To summarize, in FIG. 9, the shorting paths between adjacent green emissive sub-pixels are between the same columns of green emissive sub-pixels in every row. However, the shorting paths between adjacent blue and red emissive sub-pixels are between the same columns of emissive sub-pixels in every other row and staggered relative to the adjacent rows.

In every row of the pixel removal region, the green emissive sub-pixel in the second column of sub-pixels is shorted to the green emissive sub-pixel in the fourth column of sub-pixels. In every row of the pixel removal region, the green emissive sub-pixel in the sixth column of sub-pixels is shorted to the green emissive sub-pixel in the eighth column of sub-pixels. Said another way, in every row of the pixel removal region, the green emissive sub-pixels in the second and sixth columns of sub-pixels are shorted to the adjacent green emissive sub-pixel in the positive X-direction.

For the red emissive sub-pixels, in every other row (e.g., in the odd rows) of the pixel removal region, the red emissive sub-pixels in the first column of sub-pixels are shorted to the adjacent red emissive sub-pixel in the positive X-direction. In every other row (e.g., in the even rows) of the pixel removal region, the red emissive sub-pixels in the first column of sub-pixels are shorted to the adjacent red emissive sub-pixel in the negative X-direction.

For the blue emissive sub-pixels, in every other row (e.g., in the odd rows) of the pixel removal region, the blue emissive sub-pixels in the third column of sub-pixels are shorted to the adjacent blue emissive sub-pixel in the positive X-direction. In every other row (e.g., in the even rows) of the pixel removal region, the blue emissive sub-pixels in the third column of sub-pixels are shorted to the adjacent blue emissive sub-pixel in the negative X-direction.

The arrangement of FIG. 9 may improve the front-of-screen (FOS) appearance of the display in region 332 relative to the arrangement of FIG. 8 (where the shorting pattern is repeated for each row).

In both FIGS. 8 and 9, gate lines (e.g., as shown in FIG. 7) and/or additional conductive paths such as power supply lines may also be included.

In the pixel removal regions FIGS. 8 and 9, only 25% of the thin-film transistor sub-pixels are included relative to the full pixel density region. This allows for more/larger high-transmittance areas 324 to be present in the pixel removal region.

Figure 10:
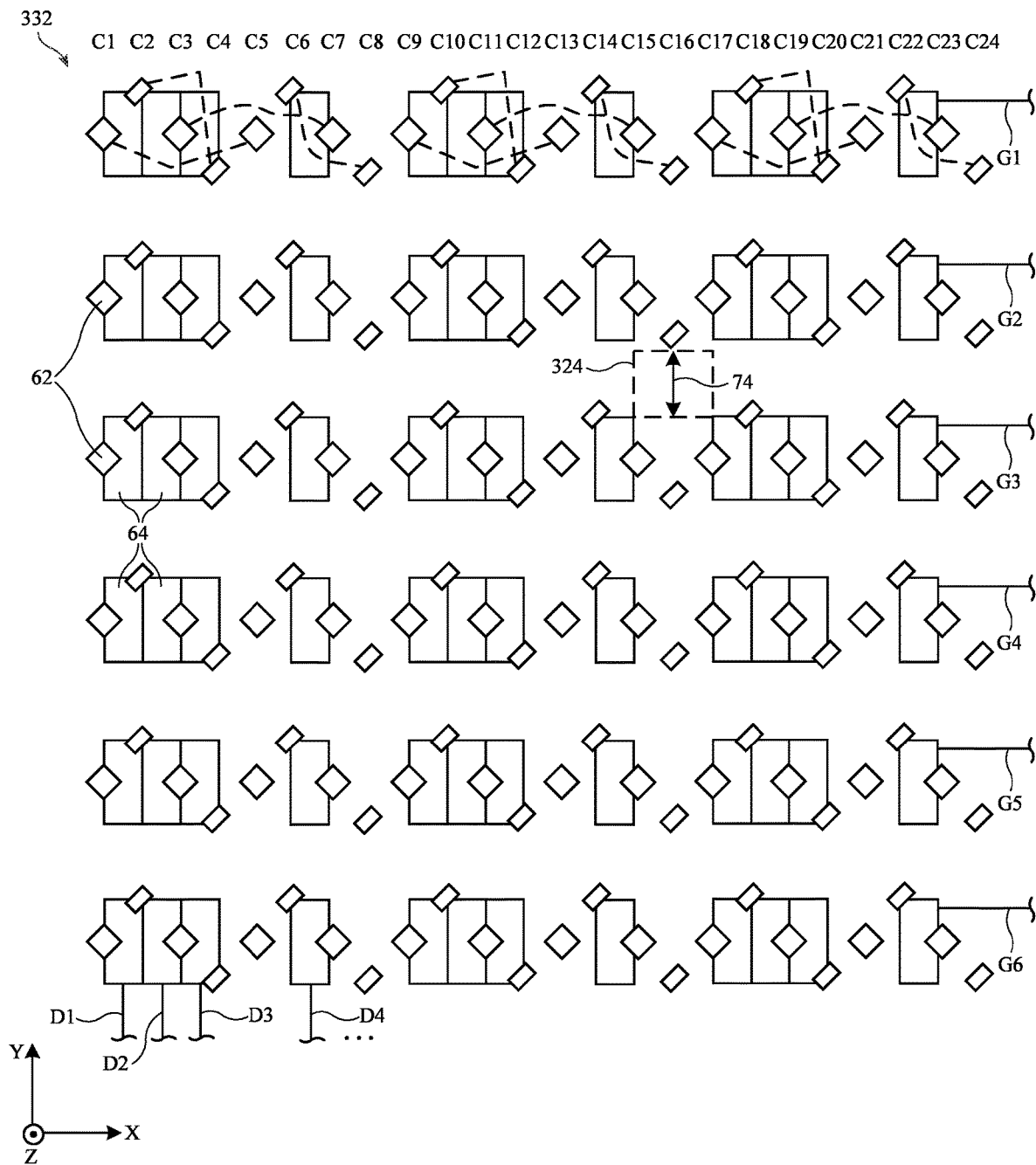
FIG. 10 is a top view of an illustrative pixel removal region in a display with a repeating baseline pattern of omitted thin-film transistor sub-pixels in accordance with an embodiment.

In one possible arrangement, the baseline pattern of FIG. 8 or FIG. 9 may be repeated across the entire pixel removal region. FIG. 10 is a top view of a pixel removal region of this type, with the pattern of FIG. 8 being repeated across the pixel removal region. In this example, there are 24 columns C1-C24 of emissive sub-pixels 62 (e.g., having a horizontal zig-zag layout of the type shown in FIG. 5). The thin-film transistor sub-pixels 64 may be arranged in a repeated baseline unit as shown in FIG. 8, with columns C1, C2, C3, and C6 having respective thin-film transistor sub-pixels. This pattern repeats every 8 emissive sub-pixels. In other words, the emissive sub-pixels in columns C9, C10, C11, and C14 have respective thin-film transistor sub-pixels. The emissive sub-pixels in columns C17, C18, C19, and C22 have respective thin-film transistor sub-pixels.

For simplicity of the drawing, the shorting paths 72 between emissive sub-pixels are only depicted for the first horizontal zig-zag row of emissive sub-pixels. However, every row of emissive sub-pixels may have shorting paths of the type shown in FIG. 8 between adjacent emissive sub-pixels of the same color. Additionally, each column of thin-film transistor sub-pixels has a corresponding data line (e.g., data lines D1, D2, D3, D4, etc. in FIG. 10) and each row of thin-film transistor sub-pixels has one or more corresponding gate lines (e.g., gate lines G1, G2, G3, G4, G5, and G6 in FIG. 10).

In FIG. 10, the distribution of thin-film transistor sub-pixels is the same across the pixel removal region. For every eight columns of emissive sub-pixels within each row, four respective thin-film transistor sub-pixels are present. In contrast with a prior art display (shown in FIGS. 23A and 23B) where thin-film transistors are totally omitted over area 1004, evenly distributing the thin-film transistor sub-pixels as in FIG. 10 (including in a region directly over an input-output component such as a camera) may reduce the cost and complexity of manufacturing the display.

Said another way, the ratio between the number of emissive sub-pixels and the number of thin-film transistor sub-pixels is the same in both small areas and large areas of pixel removal area 332. In FIG. 10, across the entire pixel removal area, there are two emissive sub-pixels for each thin-film transistor sub-pixel. In each row, there are two emissive sub-pixels for each thin-film transistor sub-pixel. Within each row, for each group of eight columns of emissive sub-pixels, there are two emissive sub-pixels for each thin-film transistor sub-pixel.

Having a consistent ratio of emissive sub-pixels for each thin-film transistor sub-pixel in this way results in a high number of small high-transmittance areas 324. As shown in FIG. 10, the maximum dimension of one of the high-transmittance areas 324 may be defined by distance 74. Distance 74 may be less than 100 microns, less than 60 microns, less than 40 microns, less than 30 microns, etc. To provide a high-transmittance area with a larger maximum dimension (e.g., a larger continuous high-transmittance area), the thin-film transistor sub-pixels may be grouped in an uneven manner within the pixel removal region.

Figure 11:
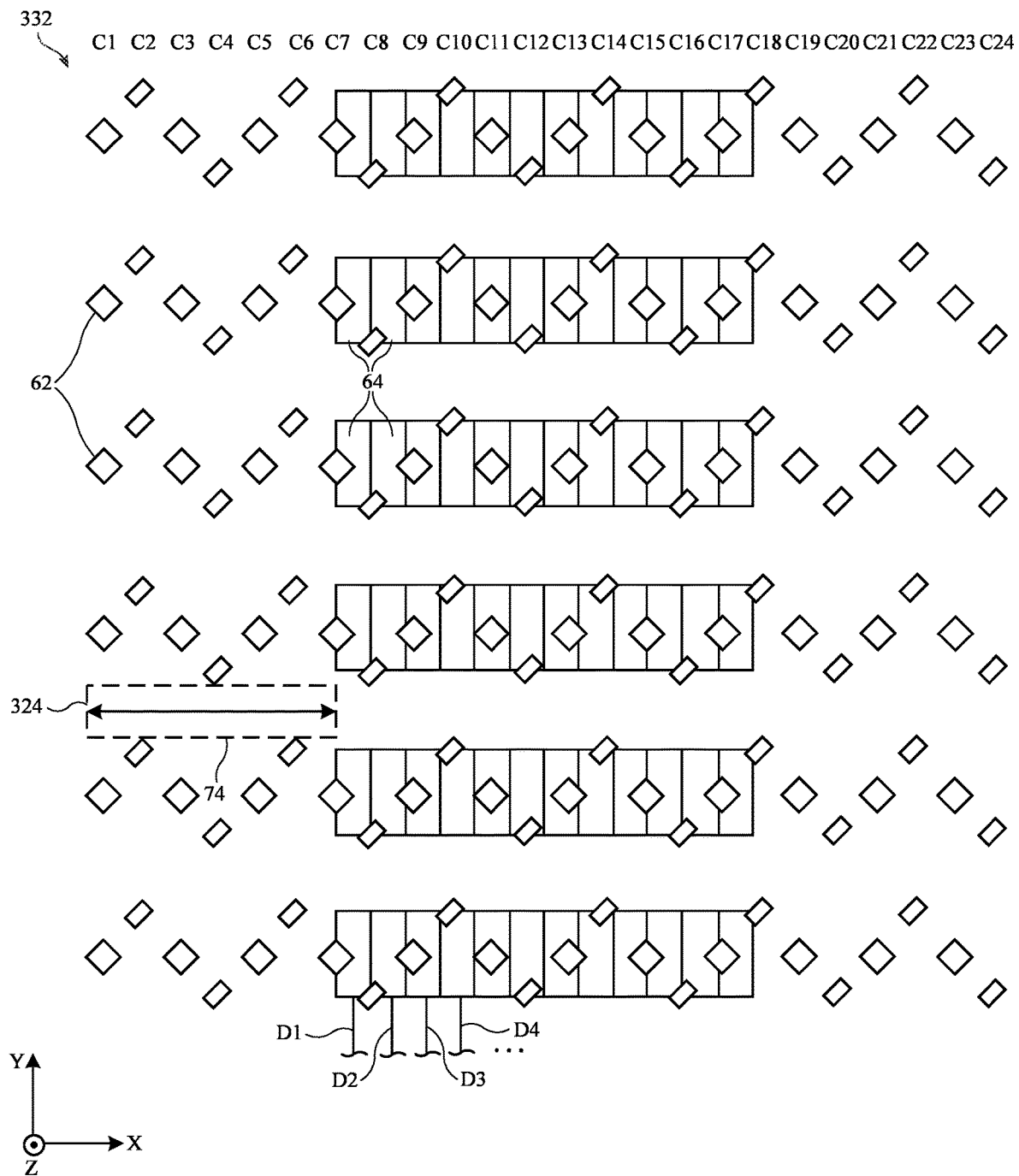
FIG. 11 is a top view of an illustrative pixel removal region in a display with thin-film transistor sub-pixels that are consolidated horizontally in accordance with an embodiment.

FIG. 11 is a top view of a pixel removal region with thin-film transistor sub-pixels consolidated horizontally in certain regions of the pixel removal region. In this example, there are 24 columns C1-C24 of emissive sub-pixels 62 (e.g., having a horizontal zig-zag layout of the type shown in FIG. 5). Across the entire pixel removal region, there may be one thin-film transistor sub-pixel for every two emissive sub-pixels. However, the thin-film transistor sub-pixels are consolidated horizontally. The adjacent group of middle columns C7-18 therefore each have a corresponding thin-film transistor sub-pixel. Meanwhile, edge columns C1-C6 and C19-C24 have no thin-film transistor sub-pixels.

Similar to as in FIG. 10, each thin-film transistor sub-pixel 64 in FIG. 11 controls two respective emissive sub-pixels that are shorted together. Each thin-film transistor sub-pixel 64 in a given row may control two respective emissive sub-pixels in the given row. The two shorted emissive sub-pixels may be emissive sub-pixels of the same color. However, the shorted emissive sub-pixels may not necessarily be adjacent emissive sub-pixels of the same color. As one illustrative example, the green emissive sub-pixel in column C8 may be shorted to the green emissive sub-pixel in column C4 (instead of the adjacent green emissive sub-pixel in column C6).

Every row of emissive sub-pixels may have shorting paths (e.g., of the type shown in FIGS. 8-10). Every row may have the same pattern of shorting paths or different rows may have different patterns of shorting paths. Each column of thin-film transistor sub-pixels has a corresponding data line (e.g., data lines D1, D2, D3, D4, etc. in FIG. 11) and each row of thin-film transistor sub-pixels may have one or more corresponding gate lines (similar to as shown in FIG. 10).

In FIG. 11, the distribution of thin-film transistor sub-pixels is not consistent across the pixel removal region. Said another way, the ratio between the number of emissive sub-pixels and the number of thin-film transistor sub-pixels is different in small and large areas of pixel removal area 332. In FIG. 11, across the entire pixel removal area, there are two emissive sub-pixels for each thin-film transistor sub-pixel. Similarly, in each row in the pixel removal area, there are two emissive sub-pixels for each thin-film transistor sub-pixel. However, within each row, the thin-film transistor sub-pixels are unevenly distributed. The middle of the pixel removal area (e.g., middle columns C7-C18) has one emissive sub-pixel for each thin-film transistor sub-pixel). The edges of the pixel removal area (e.g., edge columns C1-C6 and C19-C24) have zero thin-film transistor sub-pixels.

Having an inconsistent ratio of emissive sub-pixels to thin-film transistor sub-pixel in this way allows for the pixel removal region 332 to include a smaller number of high-transmittance areas 324 in FIG. 11 relative to FIG. 10. The high-transmittance areas 324 in FIG. 11 may have a larger maximum dimension than the high-transmittance areas in FIG. 10. As shown in FIG. 11, the maximum dimension of a high-transmittance area 324 in pixel removal region 332 may be defined by distance 74. Distance 74 in FIG. 11 is greater than distance 74 in FIG. 10. Distance 74 may be greater than 40 microns, greater than 80 microns, greater than 100 microns, greater than 200 microns, greater than 300 microns, greater than 400 microns, less than 600 microns, between 200 and 500 microns, etc.

Grouping the thin-film transistor sub-pixels therefore allows for larger, uninterrupted high-transmittance areas. These larger high-transmittance areas may be preferable compared to a high number of small high-transmittance areas in certain applications. For example, when pixel removal region 332 overlaps an input-output component such as an infrared light-emitting component, it may be desirable to ensure the light from the light-emitting component does not reach the thin-film transistor sub-pixels. With a high number of small high-transmittance areas, a micro-lens array or other optical film may be necessary to focus the infrared light from the light source through the high-transmittance areas (and avoid the thin-film transistor sub-pixels). With the larger high-transmittance areas of FIG. 11, this type of microlens array may be omitted, reducing manufacturing cost and complexity. This example is merely illustrative, and having larger high-transmittance areas may also be preferable compared to a high number of small high-transmittance areas in other input-output applications such as sensor applications.

Figure 12:
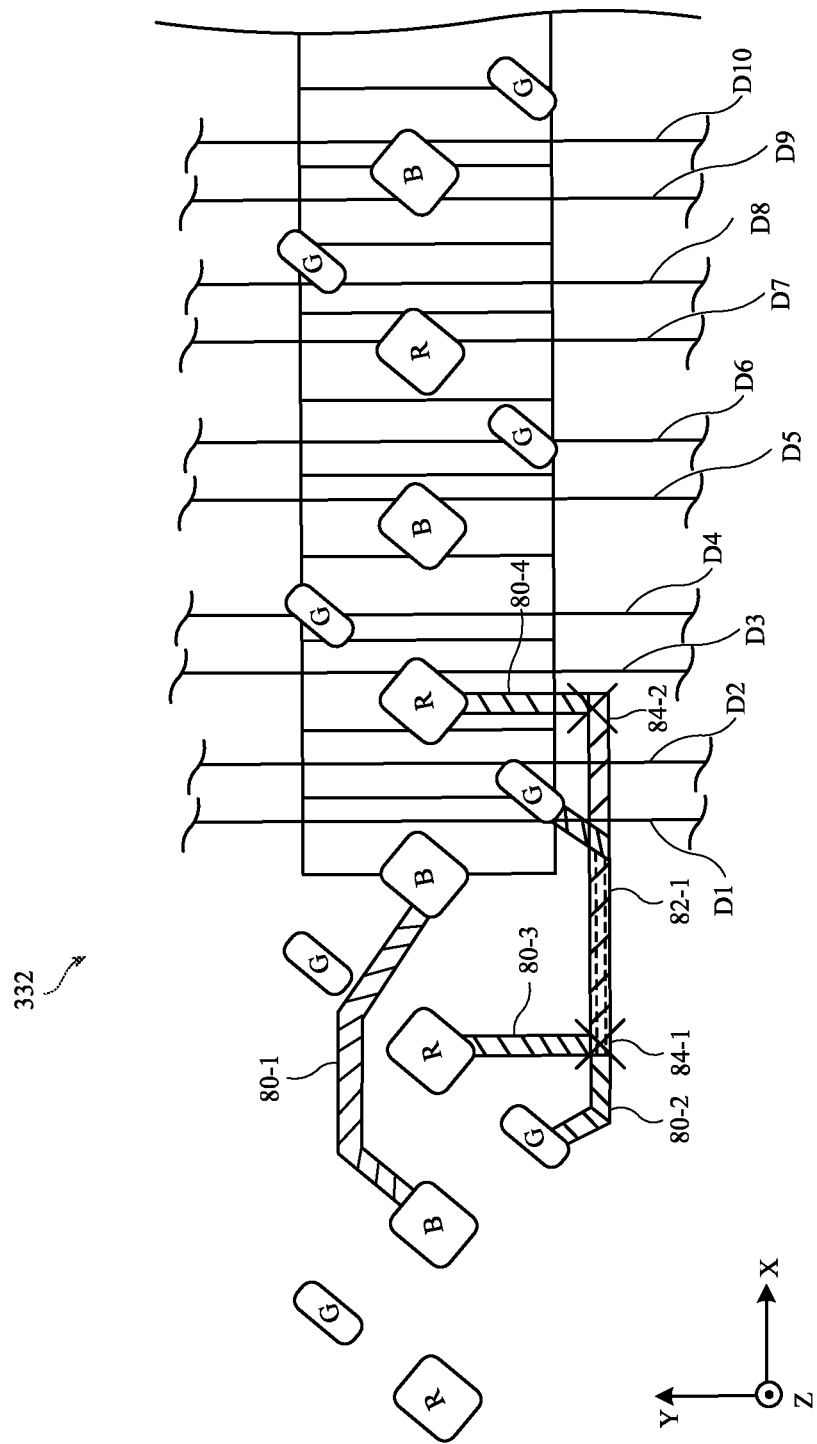
FIG. 12 is a top view of an illustrative pixel removal region in a display showing how shorting paths between emissive sub-pixels may be formed using multiple metal layers on different planes in accordance with an embodiment.

FIG. 12 is a top view of the pixel removal region of FIG. 11. Specifically, FIG. 12 shows some of the ways in which emissive sub-pixels of the same color may be shorted together using shorting paths.

As previously mentioned, shorting paths 72 may be formed by conductive routing lines on one or more layers within the display (e.g., within the thin-film transistor circuitry layer in the display). FIG. 12 shows how multiple layers of conductive routing lines may be used. A first metal layer 80 includes portions that form conductive routing lines for shorting paths between emissive pixels. A second metal layer 82 also includes portions that form conductive routing lines for shorting paths between emissive pixels. The first and second metal layers 80 and 82 may be formed in different planes along the Z-axis. For example, metal layer 80 may be positioned in a first plane that is plane parallel to the XY-plane whereas metal layer 82 may be positioned in a second plane that is plane parallel to the first plane and that is at a different height along the Z-axis relative to the first plane.

Metal layer 80 may include various portions that form part or all of shorting paths between anodes. Metal layer portion 80-1 forms a shorting path between two blue emissive sub-pixels (e.g., between the anodes of the sub-pixels). Metal layer portion 80-2 forms a shorting path between two green emissive sub-pixels (e.g., between the anodes of the sub-pixels). Metal layer portions 80-3 and 80-4 form part of a shorting path between two red emissive sub-pixels (e.g., between the anodes of the sub-pixels). Metal layer portion 82-1 forms part of a shorting path between two red emissive sub-pixels.

Routing paths 80-3, 82-1, and 80-4 combine to form the shorting path between the two red emissive sub-pixels. Because the metal layers 80 and 82 are in different planes, conductive vias 84-1 and 84-2 may be included to electrically connect the metal layers to form a unitary shorting path. Metal layer portion 80-3 is shorted to metal layer portion 82-1 by conductive via 84-1. Metal layer portion 80-4 is shorted to metal layer portion 82-1 by conductive via 84-2. Additional conductive vias may be included to electrically connect metal layer and/or metal layer 82 to the anodes of the emissive sub-pixels.

Because the metal layers 80 and 82 are in different planes, shorting paths may overlap each other in the Z-direction if desired. FIG. 12 shows how metal layer portion 80-2 vertically overlaps metal layer portion 82-1 in the Z-direction (e.g., when viewed from above). Having multiple planes of routing lines in this way increases the available surface area for routing the shorting paths, which alleviates crowding of the shorting paths and increases transmission through the display in the pixel removal area.

Having multiple planes of metal layers for the shorting paths also allows for additional signal lines such as data lines D to be bridged where necessary. FIG. 12 shows how a metal layer portion 82-1 may be used to bridge data lines D1 and D2. Metal layer 80 may be on the same plane as data lines D. This may prevent shorting paths formed from metal layer 80 from bridging data lines D, as the shorting paths would be undesirably shorted to the data lines. Therefore, the shorting path portions formed by metal layer 80 may be electrically connected to metal layer 82 which is at a different plane than data lines D. Metal layer portion 82-1 therefore can bridge data lines D1 and D2 without shorting to the data lines.

Each one of metal layers 80 and 82 may have additional portions that serve additional functions within the display. For example, each one of metal layers 80 and 82 may have an additional portion that serves as at least a portion of a data line, at least a portion of a gate line, at least a portion of a positive power supply distribution line, at least a portion of a ground power supply distribution line ELVSS, at least a portion of a thin-film transistor 28 for a pixel, etc.

Portions of metal layers 80 and 82 that are used to form shorting paths in the display may be transparent (e.g., having a transparency of greater than 80%, greater than 90%, greater than 95%, greater than 99%, etc.). In general, any of the signal routing lines (e.g., data lines, power supply lines, shorting paths, etc.) in the display may be transparent or have transparent portions in pixel removal area 332 to maximize transparency in the pixel removal area.

Figure 13:
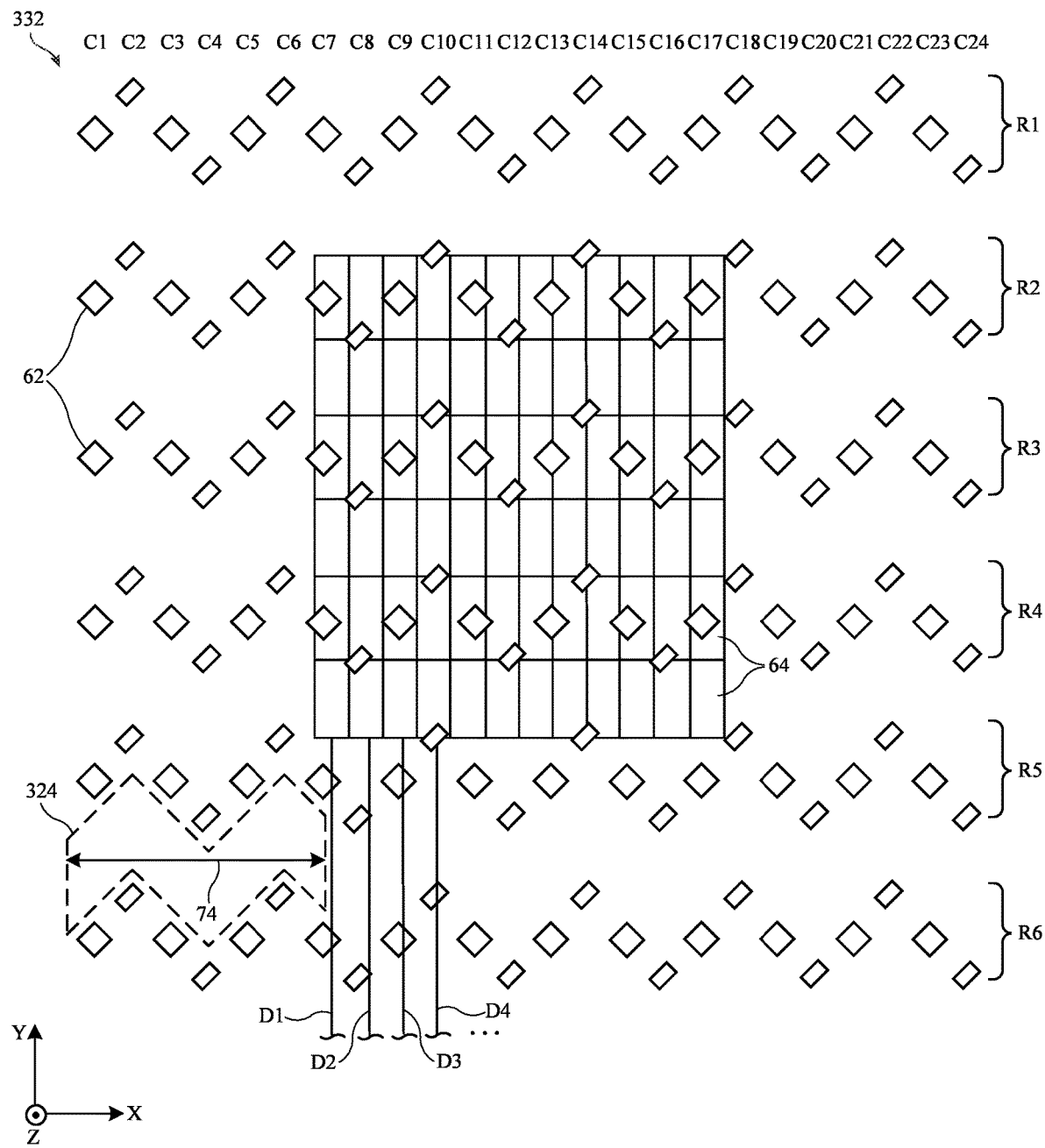
FIG. 13 is a top view of an illustrative pixel removal region in a display with thin-film transistor sub-pixels that are consolidated both horizontally and vertically in accordance with an embodiment.

In addition to or instead of grouping the thin-film transistor sub-pixels horizontally (e.g., along the X-axis), the thin-film transistor sub-pixels may be grouped vertically (e.g., along the Y-axis). FIG. 13 is a top view of a pixel removal region where the thin-film transistor sub-pixels are grouped both horizontally and vertically.

In this example, there are 24 columns C1-C24 of emissive sub-pixels 62 (e.g., having a horizontal zig-zag layout of the type shown in FIG. 5). The emissive sub-pixels in FIG. 13 are arranged in 6 horizontal zig-zag rows R1-R6. Across the entire pixel removal region, there may be one thin-film transistor sub-pixel for two emissive sub-pixels. However, the thin-film transistor sub-pixels are consolidated horizontally and vertically. The adjacent group of middle columns C7-18 therefore each have a corresponding thin-film transistor sub-pixel. Meanwhile, columns C1-C6 and C19-C24 have no thin-film transistor sub-pixels.

Similar to as in FIGS. 10 and 11, each thin-film transistor sub-pixel 64 in FIG. 13 controls two respective emissive sub-pixels that are shorted together. Each thin-film transistor sub-pixel 64 in a given row may control two respective emissive sub-pixels. The two shorted emissive sub-pixels may be emissive sub-pixels of the same color. However, the shorted emissive sub-pixels may not necessarily be adjacent emissive sub-pixels of the same color. The shorted emissive sub-pixels may be in different rows and/or different columns. For example, a blue emissive sub-pixel in column C7, row R2 may be shorted to a blue emissive sub-pixel in column C3, row R2 (e.g., same row, different column), may be shorted to a blue emissive sub-pixel in column C7, row R1 (e.g., different row, same column), or may be shorted to a blue emissive sub-pixel in column C3, row R1 (e.g., different row, different column).

Each column of thin-film transistor sub-pixels has a corresponding data line (e.g., data lines D1, D2, D3, D4, etc. in FIG. 13) and each row of thin-film transistor sub-pixels may have one or more corresponding gate lines (similar to as shown in FIG. 10).

In FIG. 13, the distribution of thin-film transistor sub-pixels is not consistent across the pixel removal region. Said another way, the ratio between the number of emissive sub-pixels and the number of thin-film transistor sub-pixels is different in small and large areas of pixel removal area 332. In FIG. 13, across the entire pixel removal area, there are two emissive sub-pixels for each thin-film transistor sub-pixel. However, some rows (e.g., edge rows R1, R5, and R6) do not include any thin-film transistor sub-pixels while other rows (e.g., middle rows R2-R6) include two thin-film transistor sub-pixels for each emissive sub-pixel. Additionally, within each row of thin-film transistor sub-pixels, the thin-film transistor sub-pixels are unevenly distributed. The middle of the pixel removal area (e.g., middle columns C7-C18) has one emissive sub-pixel for each thin-film transistor sub-pixel. The edges of the pixel removal area (e.g., edge columns C1-C6 and C19-C24) have zero thin-film transistor sub-pixels.

As shown in FIG. 13, there may be a first subset of rows of thin-film transistor sub-pixels that are overlapped by emissive sub-pixels (e.g., the first, third, and fifth rows of thin-film transistor sub-pixels). Additionally, there may be a second subset of rows of thin-film transistor sub-pixels with little overlap from emissive sub-pixels that are interposed between the first subset of rows (e.g., the second, fourth, and sixth rows of thin-film transistor sub-pixels).

Having an inconsistent ratio of emissive sub-pixels for each thin-film transistor sub-pixel in this way allows for the pixel removal region to include a smaller number of high-transmittance areas 324 in FIG. 13 relative to FIG. 10. However, the high-transmittance areas 324 in FIG. 13 may have a larger maximum dimension than the high-transmittance areas in FIG. 10. As shown in FIG. 13, the maximum dimension of a high-transmittance area 324 in pixel removal region 332 may be defined by distance 74. Distance 74 in FIG. 13 is greater than distance 74 in FIG. 10. Distance 74 may be greater than 40 microns, greater than 80 microns, greater than 100 microns, greater than 200 microns, greater than 300 microns, greater than 400 microns, less than 600 microns, between 200 and 500 microns, etc.

Grouping the thin-film transistor sub-pixels allows for larger, uninterrupted high-transmittance areas. These larger high-transmittance areas may be preferable compared to a high number of small high-transmittance areas in certain applications. For example, when pixel removal region 324 overlaps an input-output component such as an infrared light-emitting component, it may be desirable to ensure the light from the light-emitting component does not reach the thin-film transistor sub-pixels. With a high number of small high-transmittance areas, a microlens array or other optical film may be necessary to focus the infrared light from the light source through the high-transmittance areas. With the larger high-transmittance areas of FIG. 13, this type of microlens array may be omitted, reducing manufacturing cost and complexity. This example is merely illustrative, and having larger high-transmittance areas may also be preferable compared to a high number of small high-transmittance areas in other input-output applications such as sensor applications.

The examples in FIGS. 11 and 13 of grouping the thin-film transistor sub-pixels in the middle of the pixel removal area is merely illustrative. If desired, the thin-film transistor sub-pixels may be grouped in any desired portion of the pixel removal area (e.g., one of the corners or edges of the pixel removal area). With appropriate signal routing, each thin-film transistor sub-pixel may have any desired position relative to the respective emissive sub-pixel(s) it controls.

Figure 14:
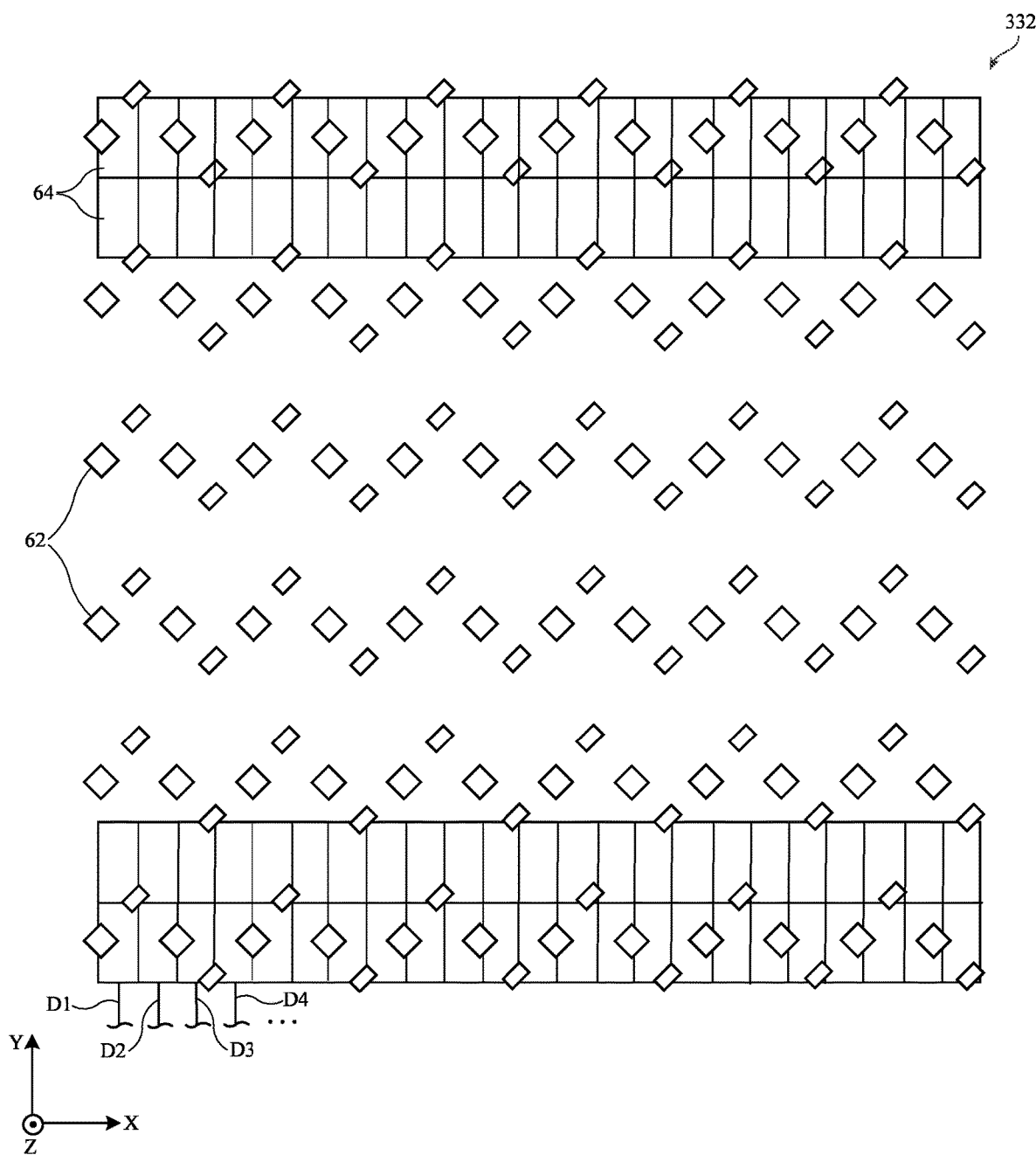
FIG. 14 is a top view of an illustrative pixel removal region in a display with thin-film transistor sub-pixels that are grouped vertically at the edges of the pixel removal region in accordance with an embodiment.

FIG. 14 is a top view of a pixel removal region where the thin-film transistor sub-pixels are grouped vertically at the edges of the pixel removal region. In this example, there are 24 columns of emissive sub-pixels 62 (e.g., having a horizontal zig-zag layout of the type shown in FIG. 5). The emissive sub-pixels in FIG. 14 are arranged in 6 horizontal zig-zag rows (similar to as shown in FIG. 13). Across the entire pixel removal region, there may be one thin-film transistor sub-pixel for two emissive sub-pixels (as previously discussed). However, the thin-film transistor sub-pixels are consolidated vertically at the edges of the pixel removal region. In other words, continuous rows of thin-film transistor sub-pixels are formed along the upper edge and the lower edge of the pixel removal region 332. This leaves the central area of the pixel removal region to have a particularly high transmittance.

Similar to as in FIGS. 10 and 11, each thin-film transistor sub-pixel 64 in FIG. 14 may control two respective emissive sub-pixels that are shorted together. The two shorted emissive sub-pixels may be emissive sub-pixels of the same color. The shorted emissive sub-pixels may be in different rows and/or different columns (as discussed in connection with FIG. 13)

Each column of thin-film transistor sub-pixels has a corresponding data line (e.g., data lines D1, D2, D3, D4, etc. in FIG. 14) and each row of thin-film transistor sub-pixels may have one or more corresponding gate lines (similar to as shown in FIG. 10).

In FIGS. 5 and 7-14, an example is shown where the pixel removal area includes 50% of the emissive sub-pixels as in the full density pixel area. This ratio applies to each color of pixel in the display. In other words, there are 50% of the blue emissive sub-pixels in the pixel removal area as there are blue emissive sub-pixels in the full pixel density area, there are 50% of the green emissive sub-pixels in the pixel removal area as there are green emissive sub-pixels in the full pixel density area, and there are 50% of the red emissive sub-pixels in the pixel removal area as there are red emissive sub-pixels in the full pixel density area. This example is merely illustrative. If desired, additional emissive sub-pixels of at least one color may be removed from the pixel removal area. This concept may be combined with the concept of shorting emissive sub-pixels to reduce the number of thin-film transistor sub-pixels (e.g., as shown in FIGS. 8 and 9).

The emissive sub-pixels of any color may have additional sub-pixels removed in the pixel removal area. As one example, there may be 50% of the blue emissive sub-pixels in the pixel removal area as there are blue emissive sub-pixels in the full pixel density area, 50% of the red emissive sub-pixels in the pixel removal area as there are red emissive sub-pixels in the full pixel density area, and 25% of the green emissive sub-pixels in the pixel removal area as there are green emissive sub-pixels in the full pixel density area (e.g., additional green emissive sub-pixels are removed). As another example, there may be 50% of the blue emissive sub-pixels in the pixel removal area as there are blue emissive sub-pixels in the full pixel density area, 50% of the green emissive sub-pixels in the pixel removal area as there are green emissive sub-pixels in the full pixel density area, and 25% of the red emissive sub-pixels in the pixel removal area as there are red emissive sub-pixels in the full pixel density area (e.g., additional red emissive sub-pixels are removed). As yet another example, there may be 50% of the green emissive sub-pixels in the pixel removal area as there are green emissive sub-pixels in the full pixel density area, 50% of the red emissive sub-pixels in the pixel removal area as there are red emissive sub-pixels in the full pixel density area, and 25% of the blue emissive sub-pixels in the pixel removal area as there are blue emissive sub-pixels in the full pixel density area (e.g., additional blue emissive sub-pixels are removed).

Figure 15:
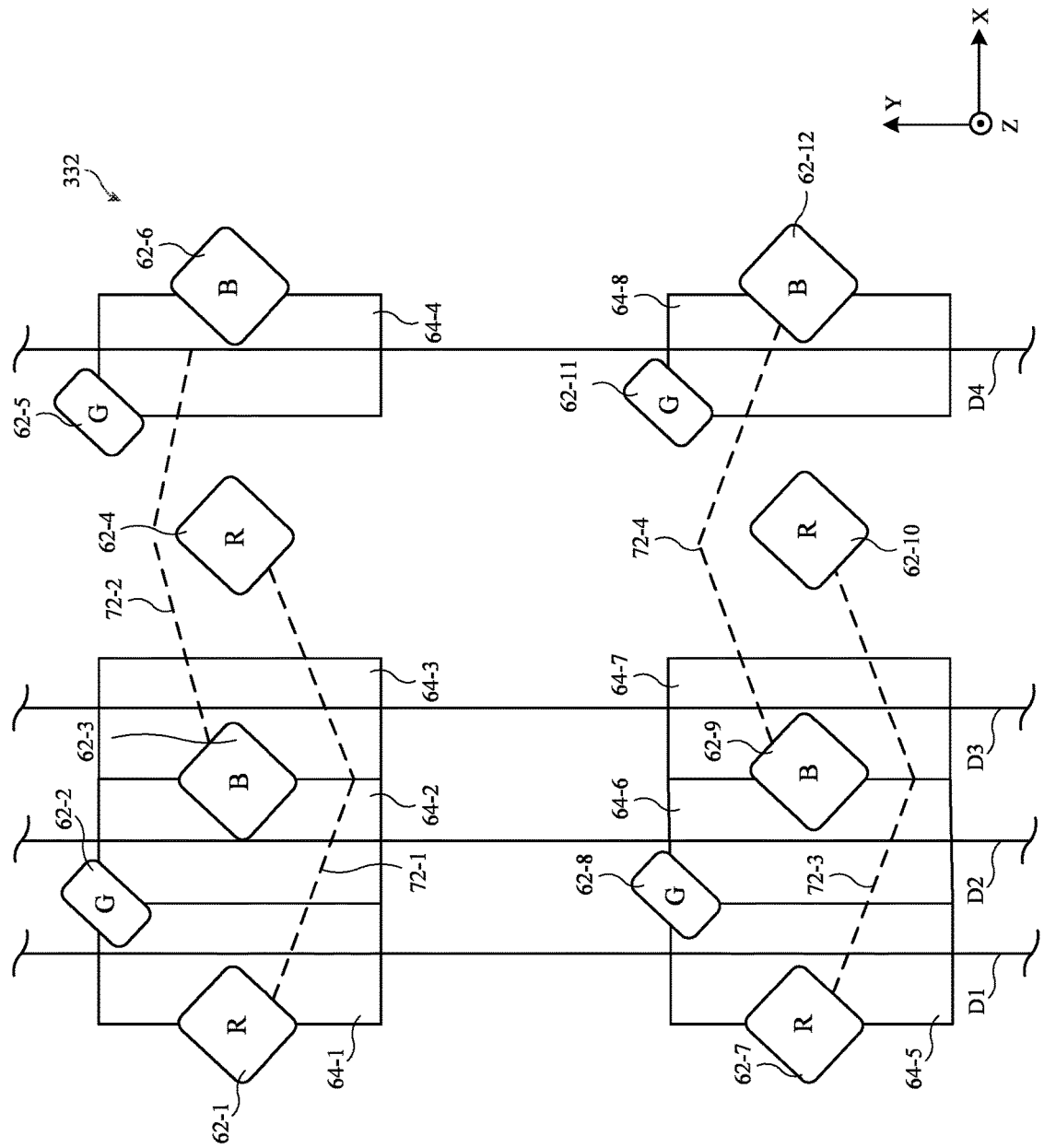
FIG. 15 is a top view of an illustrative pixel removal region in a display where some of the thin-film transistor sub-pixels control two respective emissive sub-pixels and additional green emissive sub-pixels are removed relative to the full pixel density area in accordance with an embodiment.

FIG. 15 is a top view of a pixel removal region where some of the thin-film transistor sub-pixels control two respective emissive sub-pixels (as described in connection with FIGS. 8 and 9) and additional green emissive sub-pixels are removed relative to the full pixel density area. As shown in FIG. 15, red emissive sub-pixel 62-1 is shorted to red emissive sub-pixel 62-4 by shorting path 72-1 and thin-film transistor sub-pixel 64-1 controls the magnitude of light emitted by both emissive sub-pixels 62-1 and 62-4. Blue emissive sub-pixel 62-3 is shorted to blue emissive sub-pixel 62-6 by shorting path 72-2 and thin-film transistor sub-pixel 64-3 controls the magnitude of light emitted by both emissive sub-pixels 62-3 and 62-6. Red emissive sub-pixel 62-7 is shorted to red emissive sub-pixel 62-10 by shorting path 72-3 and thin-film transistor sub-pixel 64-5 controls the magnitude of light emitted by both emissive sub-pixels 62-7 and 62-10. Blue emissive sub-pixel 62-9 is shorted to blue emissive sub-pixel 62-12 by shorting path 72-4 and thin-film transistor sub-pixel 64-7 controls the magnitude of light emitted by both emissive sub-pixels 62-9 and 62-12.

Every other green emissive sub-pixel is removed in FIG. 15 relative to the arrangement of FIG. 8. Therefore, there are 50% of the blue emissive sub-pixels in the pixel removal area as there are blue emissive sub-pixels in the full pixel density area, 50% of the red emissive sub-pixels in the pixel removal area as there are red emissive sub-pixels in the full pixel density area, and 25% of the green emissive sub-pixels in the pixel removal area as there are green emissive sub-pixels in the full pixel density area.

Unlike the red and blue emissive sub-pixels, each green emissive sub-pixel in the pixel removal area is not shorted to another emissive sub-pixel. In other words, thin-film transistor sub-pixel 64-2 controls the magnitude of light emitted by only green emissive sub-pixel 62-2. Thin-film transistor sub-pixel 64-4 controls the magnitude of light emitted by only green emissive sub-pixel 62-5. Thin-film transistor sub-pixel 64-6 controls the magnitude of light emitted by only green emissive sub-pixel 62-8. Thin-film transistor sub-pixel 64-8 controls the magnitude of light emitted by only green emissive sub-pixel 62-11.

Each column of thin-film transistor sub-pixels is coupled to a respective data line. As shown in FIG. 15, data line D1 provides data to thin-film transistor sub-pixels 64-1 and 64-5, data line D2 provides data to thin-film transistor sub-pixels 64-2 and 64-6, data line D3 provides data to thin-film transistor sub-pixels 64-3 and 64-7, and data line D4 provides data to thin-film transistor sub-pixels 64-4 and 64-8.

Pixel removal region 332 in FIG. 15 therefore has 37.5% of the emissive sub-pixels, 25% of the thin-film transistor sub-pixels, and 50% of the data lines compared to a full pixel density region. The additional omitted emissive sub-pixels in the pixel removal region allow for increased transmission through the pixel removal region, thereby improving the performance of the pixel removal region. The total transmission of the pixel removal region in FIG. 15 may be greater than 45%, greater than 50%, greater than 55% greater than 60%, between 50% and 60%, etc.

Figure 16:
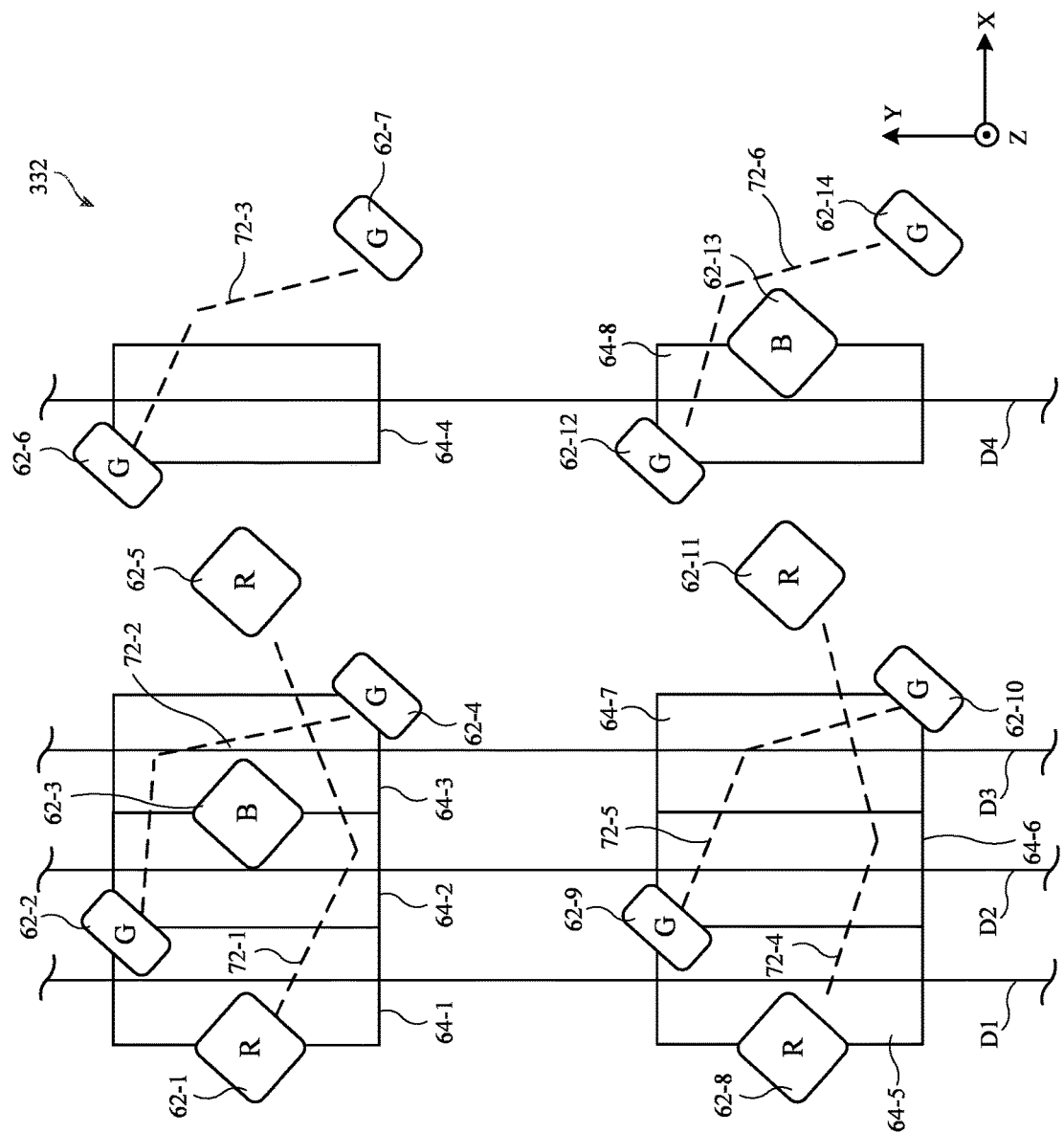
FIG. 16 is a top view of an illustrative pixel removal region in a display where some of the thin-film transistor sub-pixels control two respective emissive sub-pixels and additional blue emissive sub-pixels are removed relative to the full pixel density area in accordance with an embodiment.

FIG. 16 is a top view of a pixel removal region where some of the thin-film transistor sub-pixels control two respective emissive sub-pixels (as described in connection with FIGS. 8 and 9) and additional blue emissive sub-pixels are removed relative to the full pixel density area. As shown in FIG. 16, red emissive sub-pixel 62-1 is shorted to red emissive sub-pixel 62-5 by shorting path 72-1 and thin-film transistor sub-pixel 64-1 controls the magnitude of light emitted by both emissive sub-pixels 62-1 and 62-5. Green emissive sub-pixel 62-2 is shorted to green emissive sub-pixel 62-4 by shorting path 72-2 and thin-film transistor sub-pixel 64-2 controls the magnitude of light emitted by both emissive sub-pixels 62-2 and 62-4. Green emissive sub-pixel 62-6 is shorted to green emissive sub-pixel 62-7 by shorting path 72-3 and thin-film transistor sub-pixel 64-4 controls the magnitude of light emitted by both emissive sub-pixels 62-6 and 62-7. Red emissive sub-pixel 62-8 is shorted to red emissive sub-pixel 62-11 by shorting path 72-4 and thin-film transistor sub-pixel 64-5 controls the magnitude of light emitted by both emissive sub-pixels 62-8 and 62-11. Green emissive sub-pixel 62-9 is shorted to green emissive sub-pixel 62-10 by shorting path 72-5 and thin-film transistor sub-pixel 64-6 controls the magnitude of light emitted by both emissive sub-pixels 62-9 and 62-10. Green emissive sub-pixel 62-12 is shorted to green emissive sub-pixel 62-14 by shorting path 72-6 and thin-film transistor sub-pixel 64-8 controls the magnitude of light emitted by both emissive sub-pixels 62-12 and 62-14.

One out of every two blue emissive sub-pixels is removed in FIG. 16 relative to the arrangement of FIG. 8. Therefore, there are 50% of the green emissive sub-pixels in the pixel removal area as there are green emissive sub-pixels in the full pixel density area, 50% of the red emissive sub-pixels in the pixel removal area as there are red emissive sub-pixels in the full pixel density area, and 25% of the blue emissive sub-pixels in the pixel removal area as there are blue emissive sub-pixels in the full pixel density area.

Unlike the red and green emissive sub-pixels, each blue emissive sub-pixel in the pixel removal area is not shorted to another emissive sub-pixel. In other words, thin-film transistor sub-pixel 64-3 controls the magnitude of light emitted by only blue emissive sub-pixel 62-3. Thin-film transistor sub-pixel 64-7 controls the magnitude of light emitted by only blue emissive sub-pixel 62-13.

Although described in FIG. 16 in connection to blue emissive sub-pixels, the same concept of removing an additional emissive sub-pixel as in FIG. 16 may be applied to the red emissive sub-pixels. However, removing extra blue emissive sub-pixels may be preferred over removing red emissive sub-pixels in certain applications (as it may be less noticeable to the viewer).

Each column of thin-film transistor sub-pixels is coupled to a respective data line. As shown in FIG. 16, data line D1 provides data to thin-film transistor sub-pixels 64-1 and 64-5, data line D2 provides data to thin-film transistor sub-pixels 64-2 and 64-6, data line D3 provides data to thin-film transistor sub-pixels 64-3 and 64-7, and data line D4 provides data to thin-film transistor sub-pixels 64-4 and 64-8.

As shown in FIG. 16, the location of the removed blue emissive sub-pixel may alternate in adjacent rows if desired. Thin-film transistor sub-pixel 64-7 may be positioned adjacent to emissive sub-pixel 62-13 if desired (e.g., the position of the blue-controlling thin-film transistor sub-pixel may also alternate in adjacent rows).

Pixel removal region 332 in FIG. 16 therefore has approximately 44% (7/16) of the emissive sub-pixels, 25% of the thin-film transistor sub-pixels, and 50% of the data lines compared to a full pixel density region. The additional omitted emissive sub-pixels in the pixel removal region allow for increased transmission through the pixel removal region, thereby improving the performance of the pixel removal region. The total transmission of the pixel removal region in FIG. 16 may be greater than 45%, greater than 50%, greater than 55% greater than 60%, between 50% and 60%, etc.

The arrangements of FIGS. 15 and 16 may provide improved transmission in the pixel removal region (without significant adverse impact on the front-of-screen performance of the display) and/or may mitigate the cost and complexity of manufacturing the display.

It should be noted that any of the aforementioned thin-film transistor sub-pixel grouping techniques (e.g., as in FIG. 10, 11, 13, or 14) may be applied to the emissive sub-pixel layout of FIG. 15 or 16 in the pixel removal area.

With the emissive sub-pixel pattern of FIG. 15, there may be a screen door effect in the pixel removal region for a viewer of the display due to a large gap between adjacent rows in the pixel removal region. To mitigate this potential artifact, the position of the green emissive sub-pixels in the pixel removal region may be adjusted.

Figure 17:
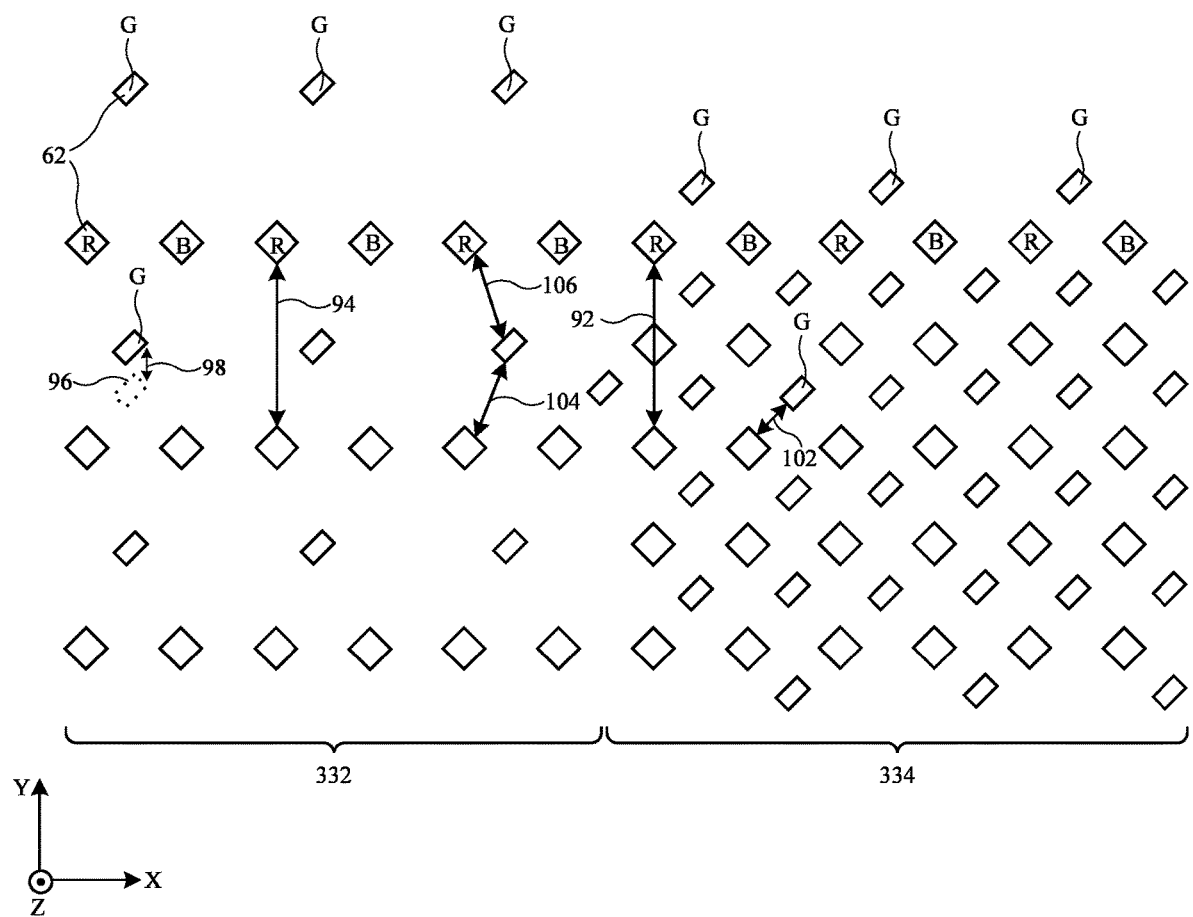
FIG. 17 is a top view of an illustrative pixel removal region showing how a row of emissive sub-pixels in the pixel removal region may be shifted relative to a corresponding row of emissive sub-pixels in the full pixel density region in accordance with an embodiment.

FIG. 17 is a top view of an illustrative display with a full pixel density region 334 and a pixel removal region 332. As shown, the pixel removal region 332 has an emissive sub-pixel layout similar to as in FIG. 15, with 50% of the blue emissive sub-pixels in the pixel removal area as there are blue emissive sub-pixels in the full pixel density area, 50% of the red emissive sub-pixels in the pixel removal area as there are red emissive sub-pixels in the full pixel density area, and 25% of the green emissive sub-pixels in the pixel removal area as there are green emissive sub-pixels in the full pixel density area.

As shown in FIG. 17, the red and blue emissive sub-pixels in pixel removal region 332 follow the same pattern as in full pixel density region 334, just with 50% of the emissive sub-pixels removed. In other words, the positions and spacing 92 between red (or blue) emissive sub-pixels in the full pixel density region 334 is the same as the corresponding positions and spacing 94 in the pixel removal region 332.

However, if the green emissive sub-pixels were to follow the same pattern (with 75% of the green emissive sub-pixels removed), the green emissive sub-pixels would be positioned at location 96. At this location, the distance between the green emissive sub-pixel and the closest red/blue emissive sub-pixels would be the same in the pixel removal region as in the full pixel density region (e.g., distance 102 in full pixel density region 334). In full pixel density region 334, this distance from the green emissive sub-pixel is approximately the same to the four closest adjacent red/blue emissive sub-pixels. In pixel removal region 332, however, the distance between each green emissive sub-pixel and the below red/blue sub-pixels would be much smaller than the distance between the green emissive sub-pixel and the above red/blue sub-pixels. This uneven spacing may cause a screen door effect for the viewer.

To mitigate the screen door effect, the green emissive sub-pixels may be shifted by distance 98 to even out the spacing between the closest red/blue emissive sub-pixels. At the shifted location, the distance 104 between each green emissive sub-pixel and the below red/blue sub-pixels may be approximately equal (e.g., within 10% of, within 5% of, within 1% of, etc.) to the distance 106 between the green emissive sub-pixel and the above red/blue sub-pixels.

Said another way, the red and blue emissive sub-pixels are positioned in an entirely parallel row across the pixel removal region and the full pixel density region (e.g., a single parallel line may be drawn through all the red and blue emissive sub-pixels in both the pixel removal region and the full pixel density region). In contrast, the green sub-pixel rows in pixel removal region 332 are shifted (e.g., by distance 98) along the Y-axis relative to the green sub-pixel rows in full pixel density region 334. Distance 98 may be less than 100 microns, less than 50 microns, greater than 10 microns, greater than 20 microns, between 20 and 40 microns, between 25 and 30 microns, or any other desired distance.

In some of the aforementioned arrangements, emissive sub-pixels are shorted together in a pixel removal region 332 and the total density of emissive sub-pixels is reduced in region 332 relative to the full pixel density region 334. However, these examples are merely illustrative. In another possible arrangement, the total density of emissive sub-pixels in high-transmittance region 332 may be the same as in full pixel density region 334. However, emissive sub-pixels of the same color may be shorted together in high-transmittance region 332 (similar to as shown and discussed in connection with FIGS. 8 and 9). This results in a 50% reduction in the number thin-film transistor sub-pixels in high-transmittance region 332 relative to full pixel density region 334. The reduced number of thin-film transistor sub-pixels in high-transmittance region 332 increases the transmittance in region 332 relative to region 334. The thin-film transistor sub-pixels in region 332 may also be consolidated (as in FIG. 11, 13, or 14, for example) to provide a portion of region 332 with an even higher transmittance.

Figure 18:
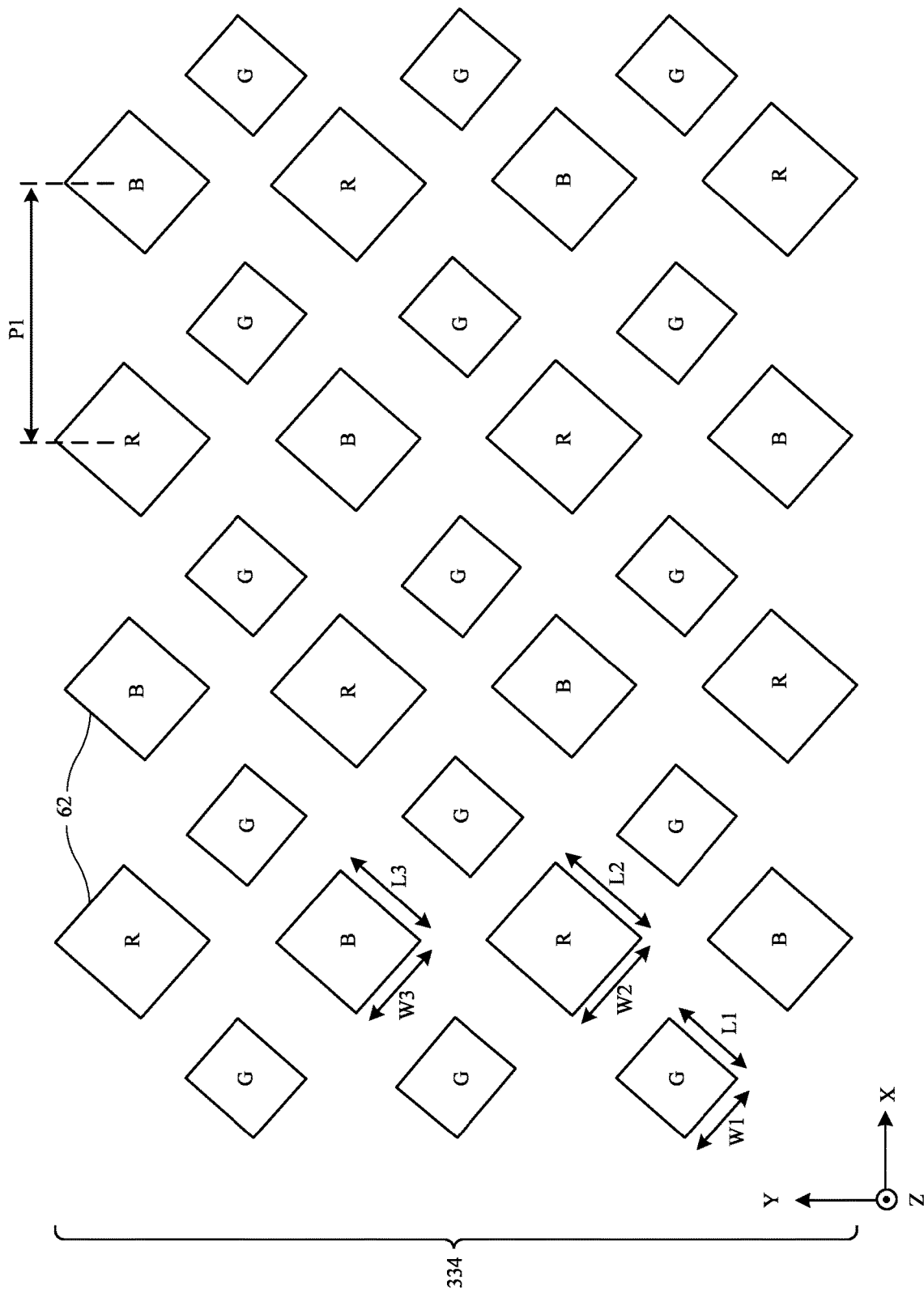
FIG. 18 is a top view of an illustrative full pixel density region in accordance with an embodiment.
Figure 19:
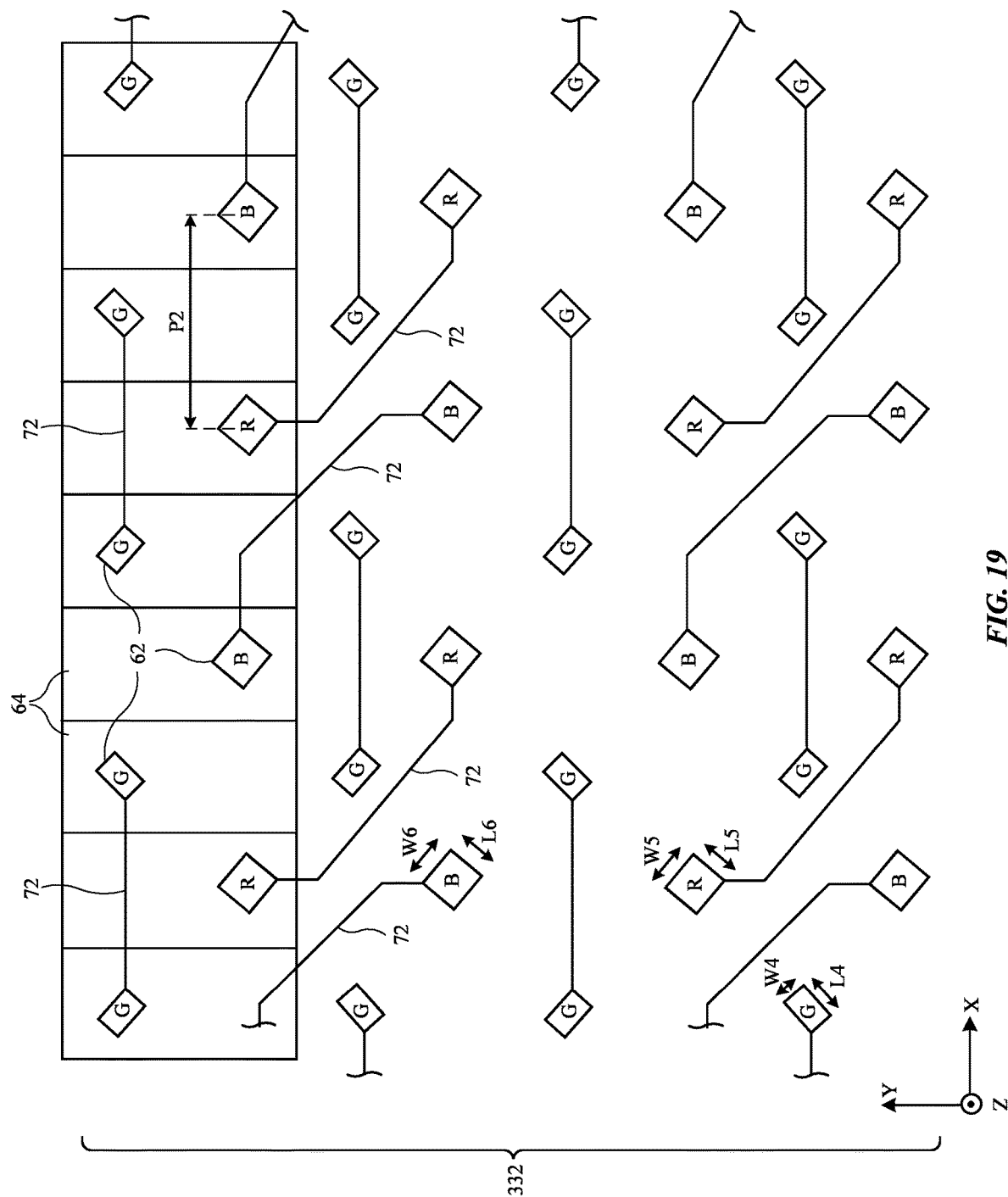
FIGS. 19-22 are top views of illustrative high-transmittance regions with the same layout but smaller emissive sub-pixels than the full pixel density region of FIG. 18 in accordance with an embodiment.

FIG. 18 is a top view of a full pixel density region of a display. FIG. 19 is a top view of a high-transmittance region of the same display as in FIG. 18. Regions 332 and 334 in FIGS. 18 and 19 may have any of the layouts of FIGS. 6A-6F.

The display of FIGS. 18 and 19 includes emissive sub-pixels 62 such as red (R), green (G), and blue (B) emissive sub-pixels 62. As shown in FIG. 18, the full pixel density region includes first rows of alternating red and blue emissive sub-pixels and second rows of green emissive sub-pixels. The first rows and second rows alternate. The resulting arrangement of emissive sub-pixels includes columns of green emissive sub-pixels that alternate with columns of alternating red and blue emissive sub-pixels. The emissive sub-pixels in region 334 may have rectangular shapes (e.g., non-square rectangular shapes or square shapes) with edges angled relative to the edges of the display (e.g., the edges of the sub-pixels are at non-zero, non-orthogonal angles relative to the X-axis and Y-axis). This example is merely illustrative. If desired, each individual sub-pixel may have edges parallel to one or more display edges. Other shapes may be used for the emissive sub-pixels if desired.

Although not explicitly shown in FIG. 18 for simplicity of the drawing, each emissive sub-pixel in FIG. 18 may be controlled by a respective thin-film transistor sub-pixel. See, for example, FIG. 7 where each emissive sub-pixel 62 is controlled by a respective thin-film transistor sub-pixel 64. In FIG. 18, the full coverage of emissive sub-pixels and corresponding thin-film transistor sub-pixels results in transmission through the display being very low. To improve the transmittance through the display, high-transmittance region 332 in FIG. 19 is modified relative to full pixel density region 334.

In FIG. 19, the layout of emissive sub-pixels 62 in high-transmittance region 332 is the same as in full pixel density region 334 of FIG. 18. In other words, as shown in FIG. 19, the high-transmittance region includes first rows of alternating red and blue emissive sub-pixels and second rows of green emissive sub-pixels. The first rows and second rows alternate. The resulting arrangement of emissive sub-pixels includes columns of green emissive sub-pixels that alternate with columns of alternating red and blue emissive sub-pixels. The emissive sub-pixels in region 332 may have rectangular shapes (e.g., non-square rectangular shapes or square shapes) with edges angled relative to the edges of the display (e.g., the edges of the sub-pixels are at non-zero, non-orthogonal angles relative to the X-axis and Y-axis).

This example is merely illustrative. If desired, each individual sub-pixel may have edges parallel to one or more display edges. Other shapes may be used for the emissive sub-pixels if desired.

The center-to-center pitch of adjacent emissive sub-pixels in a single row is the same (or similar) in high-transmittance region 332 as in full pixel density region 334. FIG. 18 shows the center-to-center pitch P1 of adjacent emissive sub-pixels in a single row. FIG. 19 shows the center-to-center pitch P2 of adjacent emissive sub-pixels in a single row. In general, the center-to-center pitch P2 between two emissive sub-pixels of respective colors in high-transmittance region 332 may differ from the center-to-center pitch P1 between two emissive sub-pixels of the same respective colors by less than 50%, less than 30%, less than 20%, less than 10%, less than 5%, less than 1%, less than 0.1%, between 0% and 20%, etc. This may hold true for both center-to-center pitch in the horizontal direction (e.g., parallel to the X-axis as depicted by P1 and P2) and center-to-center pitch in the vertical direction (e.g., parallel to the Y-axis).

The number of emissive sub-pixels per unit area in high-transmittance region 332 may differ from the number of emissive sub-pixels per unit area in region 334 by less than 50%, less than 30%, less than 20%, less than 10%, less than 5%, less than 1%, less than 0.1%, between 0% and 20%, etc.

Although the layout of the emissive sub-pixels (e.g., the colors and center-to-center spacing) in FIG. 19 is the same as in FIG. 18, the emissive sub-pixels in FIG. 19 may be smaller than the corresponding emissive sub-pixels in FIG. 18. FIG. 18 shows how each green emissive sub-pixel has a length L1 and a width W1, each red emissive sub-pixel has a length L2 and a width W2, and each blue emissive sub-pixel has a length L3 and a width W3. In FIG. 19, each green emissive sub-pixel has a length L4 and a width W4, each red emissive sub-pixel has a length L5 and a width W5, and each blue emissive sub-pixel has a length L6 and a width W6. The length L1 of the green emissive sub-pixels in full pixel density region 334 is greater than the length L4 of the green emissive sub-pixels in high-transmittance region 332 (e.g., by more than 5%, more than 10%, more than 20%, more than 50%, more than 100%, more than 200%, between 100% and 300%, less than 300%, etc.). The length L2 of the red emissive sub-pixels in full pixel density region 334 is greater than the length L5 of the red emissive sub-pixels in high-transmittance region 332 (e.g., by more than 5%, more than 10%, more than 20%, more than 50%, more than 100%, more than 200%, between 100% and 300%, less than 300%, etc.). The length L3 of the blue emissive sub-pixels in full pixel density region 334 is greater than the length L6 of the blue emissive sub-pixels in high-transmittance region 332 (e.g., by more than 5%, more than 10%, more than 20%, more than 50%, more than 100%, more than 200%, between 100% and 300%, less than 300%, etc.). The width W1 of the green emissive sub-pixels in full pixel density region 334 is greater than the width W4 of the green emissive sub-pixels in high-transmittance region 332 (e.g., by more than 5%, more than 10%, more than 20%, more than 50%, more than 100%, more than 200%, between 100% and 300%, less than 300%, etc.). The width W2 of the red emissive sub-pixels in full pixel density region 334 is greater than the width W5 of the red emissive sub-pixels in high-transmittance region 332 (e.g., by more than 5%, more than 10%, more than 20%, more than 50%, more than 100%, more than 200%, between 100% and 300%, less than 300%, etc.). The width W3 of the blue emissive sub-pixels in full pixel density region 334 is greater than the width W6 of the blue emissive sub-pixels in high-transmittance region 332 (e.g., by more than 5%, more than 10%, more than 20%, more than 50%, more than 100%, more than 200%, between 100% and 300%, less than 300%, etc.). The total area of each green emissive sub-pixel in full pixel density region 334 is greater than the total area of each green emissive sub-pixel in high-transmittance region 332 (e.g., by more than 5%, more than 10%, more than 20%, more than 50%, more than 100%, more than 200%, more than 500%, more than 1000%, less than 1000%, between 200% and 1000%, between 100% and 300%, etc.). The total area of each blue emissive sub-pixel in full pixel density region 334 is greater than the total area of each blue emissive sub-pixel in high-transmittance region 332 (e.g., by more than 5%, more than 10%, more than 20%, more than 50%, more than 100%, more than 200%, more than 500%, more than 1000%, less than 1000%, between 200% and 1000%, between 100% and 300%, etc.). The total area of each red emissive sub-pixel in full pixel density region 334 is greater than the total area of each red emissive sub-pixel in high-transmittance region 332 (e.g., by more than 5%, more than 10%, more than 20%, more than 50%, more than 100%, more than 200%, more than 500%, more than 1000%, less than 1000%, between 200% and 1000%, between 100% and 300%, etc.).

Reducing the size of the emissive sub-pixels in region 332 relative to region 334 increases the transmittance through region 332 (because less of region 332 is occupied by the opaque components (e.g., the anodes) of the emissive sub-pixels.

Additional transmittance improvements may be achieved in region 332 by shorting together adjacent emissive sub-pixels (as previously discussed in connection with FIGS. 8 and 9, for example). One thin-film transistor sub-pixel is therefore used to control two respective emissive sub-pixels in region 332.

Figure 20:
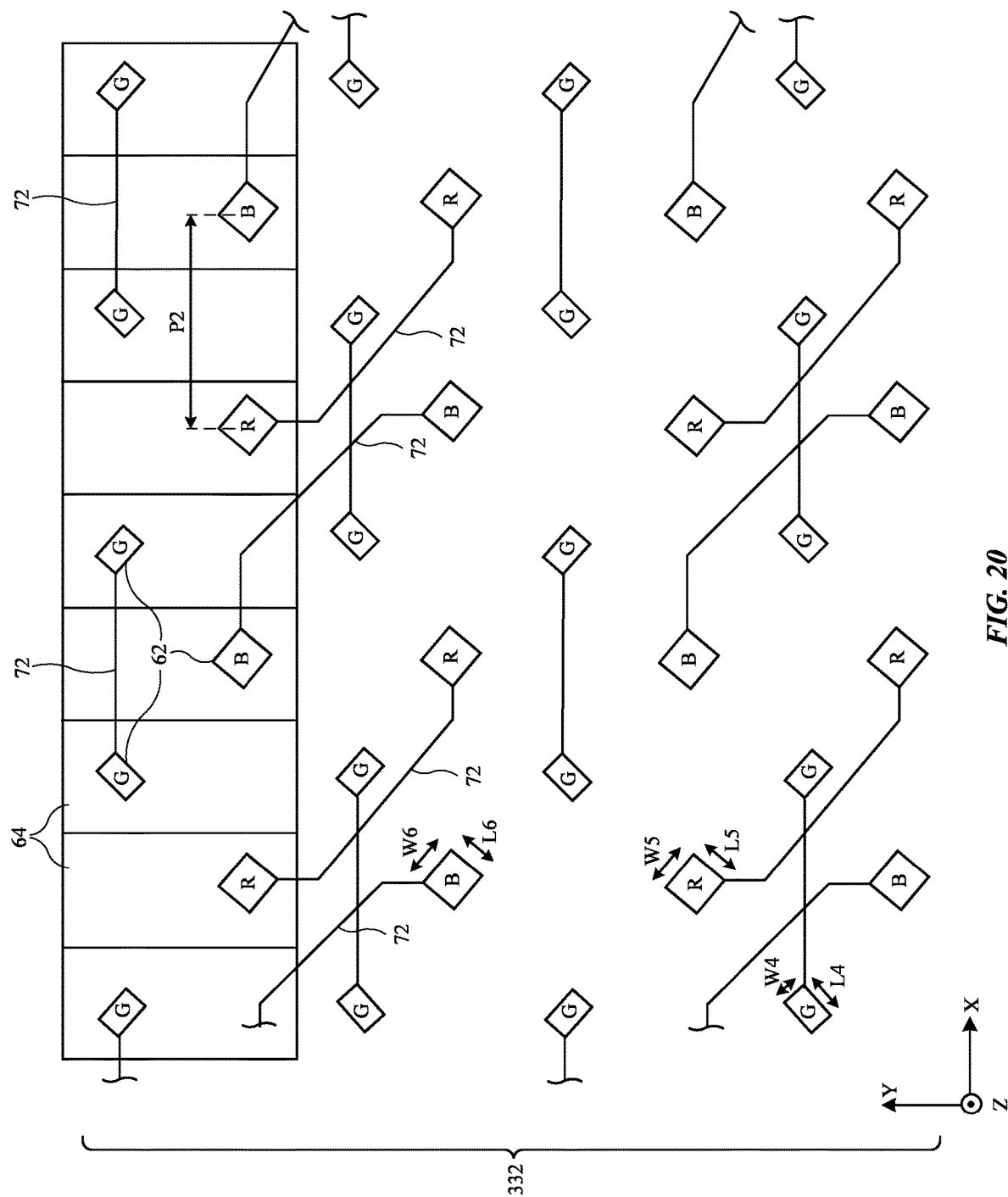
Figure 21:
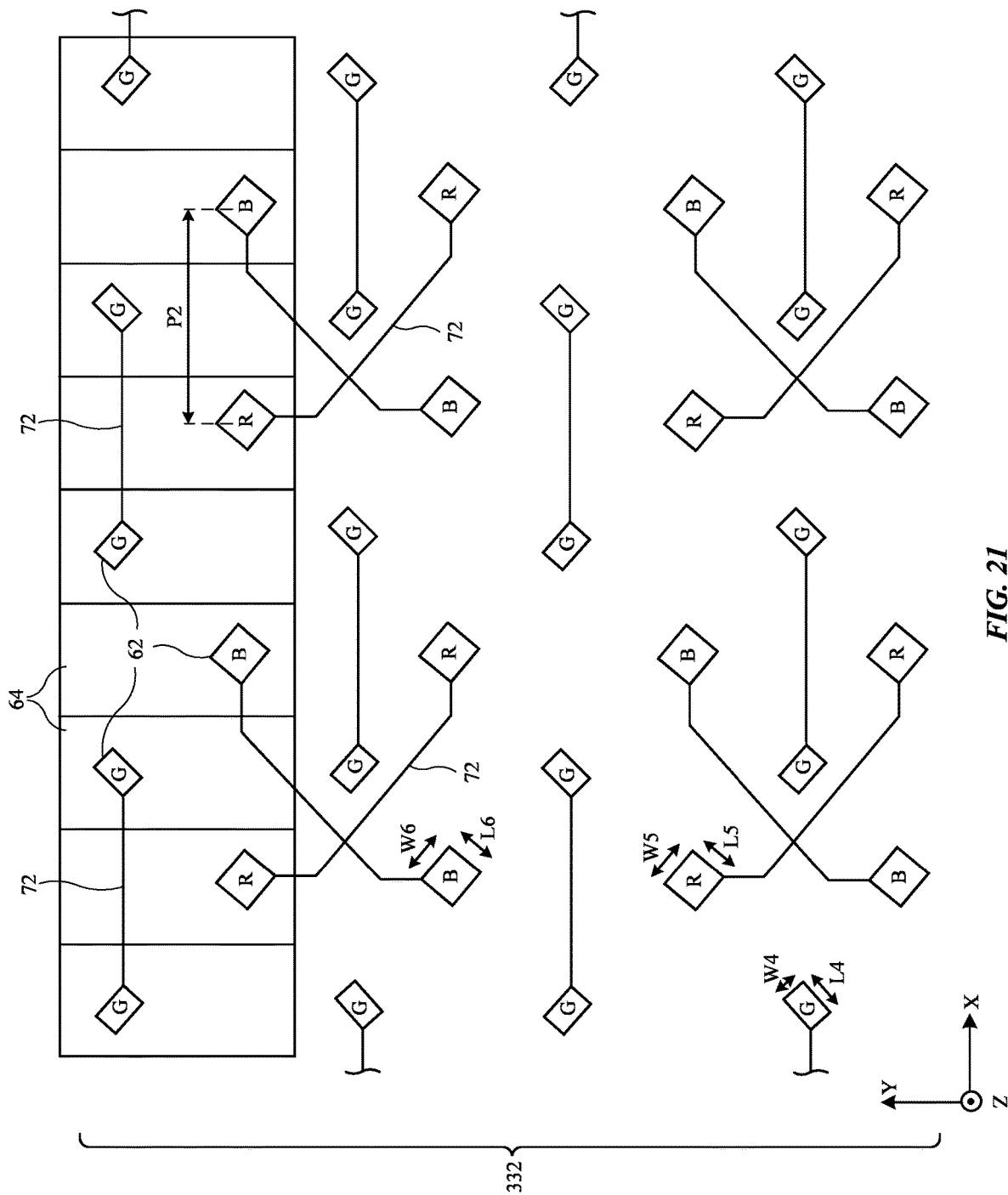
Figure 22:
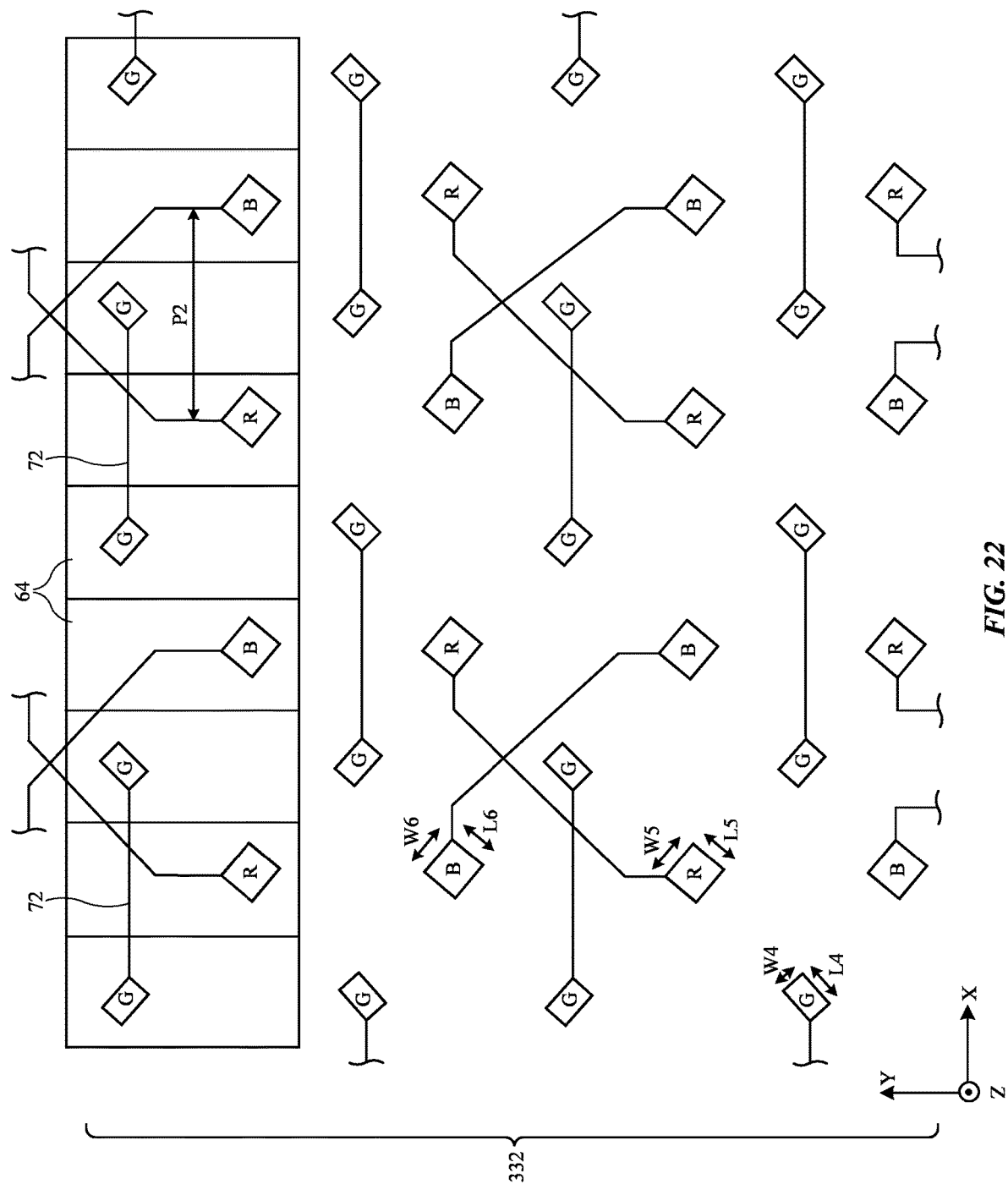

As shown in FIG. 19, pairs of emissive sub-pixels of the same color are shorted together using shorting paths 72. In the arrangement of FIG. 19, each green emissive sub-pixel is shorted to a green emissive sub-pixel in the same row, each red emissive sub-pixel is shorted to a red emissive sub-pixel in a different row, and each blue emissive sub-pixel is shorted to a blue emissive sub-pixel in a different row. The shorting of the sub-pixels may vary in different rows. For example, consider a given column of green emissive sub-pixels in FIG. 19. In every other row of green emissive sub-pixels within the given column, the green emissive sub-pixel is shorted to the green emissive sub-pixel to its right. In every other row of green emissive sub-pixels within the given column, the green emissive sub-pixel is shorted to the green emissive sub-pixel to its left. Similarly, consider a given column of alternating red and blue emissive sub-pixels in FIG. 19. In every other row of emissive sub-pixels within the given column, the emissive sub-pixel is shorted to the emissive sub-pixel of its color to its right. In every other row of emissive sub-pixels within the given column, the emissive sub-pixel is shorted to the emissive sub-pixel of its color to its left. This arrangement is merely illustrative, and the emissive sub-pixels may be shorted together according to other patterns such as the patterns of FIGS. 20-22 if desired. As another possible example (shown in FIGS. 21 and 22 for example), for every column of alternating red and blue emissive sub-pixels, each emissive sub-pixel is shorted to the emissive sub-pixel of its color on the same side (instead of alternating as in FIG. 19). In other words, half of the columns of alternating red and blue emissive sub-pixels have each emissive sub-pixel shorted to the emissive sub-pixel of its color to its left and half of the columns of alternating red and blue emissive sub-pixels have each emissive sub-pixel shorted to the emissive sub-pixel of its color to its right. The shorting paths may not overlap in the vertical direction (as in FIG. 19) or may overlap if desired (see, for example, FIG. 12 and FIGS. 20-22).

Shorting paths 72 in FIG. 19 may be formed by conductive routing lines on one or more layers within the display (e.g., within the thin-film transistor circuitry layer in the display). Each shorting path may electrically connect the first anode of a first emissive sub-pixel to the second anode of a second emissive sub-pixel. In this way, when a thin-film transistor sub-pixel applies a drive voltage to the first anode, the drive voltage is also applied to the second anode. Both the first and second emissive sub-pixels therefore emit approximately the same amount of light. This partially reduces the effective resolution of the display in the high-transmittance region (since the shorted pixels necessarily emit the same amount of light). However, the display may still have a satisfactory appearance to the viewer in region 332 even with the shorted emissive sub-pixels.

Shorting together pairs of emissive sub-pixels (that are controlled by a single respective thin-film transistor sub-pixel) results in a 50% reduction in the number thin-film transistor sub-pixels per unit area in high-transmittance region 332 relative to full pixel density region 334. The reduced number of thin-film transistor sub-pixels per unit area in high-transmittance region 332 increases the transmittance in region 332 relative to region 334.

In one possible arrangement, the thin-film transistor sub-pixels in region 332 may be evenly distributed across high-transmittance region 332 (e.g., similar to as in FIG. 10 with no thin-film transistor sub-pixel consolidation). Alternatively, the thin-film transistor sub-pixels in region 332 may be consolidated (e.g., unevenly distributed across region 332 as in FIG. 11, 13, or 14, for example) to provide a portion of region 332 with an even higher transmittance. FIG. 19 shows an example where the thin-film transistor sub-pixels 64 are consolidated (e.g., in one or more rows). The area of region 332 with the thin-film transistor sub-pixels will have a lower transmittance as a result. However, the remaining portion of region 332 that is not covered by the thin-film transistor sub-pixels will provide a large high transmittance area. The thin-film transistor sub-pixels in FIG. 19 may be consolidated in the center of region 332, along one or more of the edges of region 332, or in any other desired manner.

With the arrangement of FIG. 19, a high-transmittance area is provided (to allow, for example, a sensing component such as a camera to operate through region 332). Additionally, because the layout of the pixels in region 332 matches the layout of the pixels in the remaining portion of the display (e.g., region 334), region 332 better matches the appearance of region 334 during display operation and visible artifacts in region 332 are mitigated.

Figure 23A:
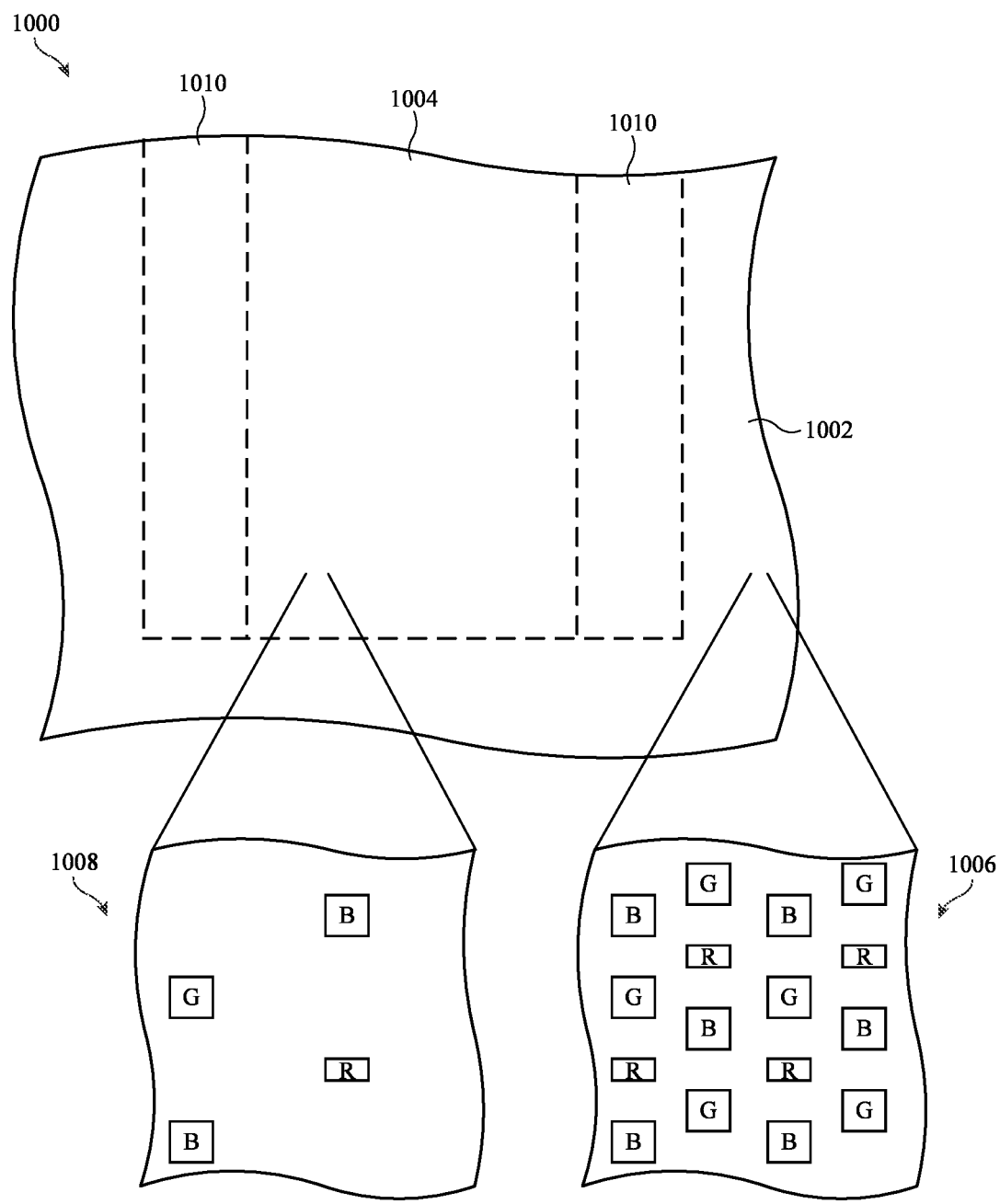
FIGS. 23A and 23B are top views of a prior art display.

FIG. 23A is a top view of a prior art display 1000. The prior art display includes an active area 1002 and an area 1004 that overlaps a camera. As shown by inset portion 1006, active area 1002 includes red (R), blue (B), and green (G) pixels. As shown by inset portion 1008, area 1004 over a camera includes red (R), blue (B), and green (G) pixels at a lower density than in area 1002. There are 4× as many emissive pixels per unit area in area 1002 as in area 1004. Display 1000 also includes transition areas 1010 on each side of area 1004.

Figure 23B:
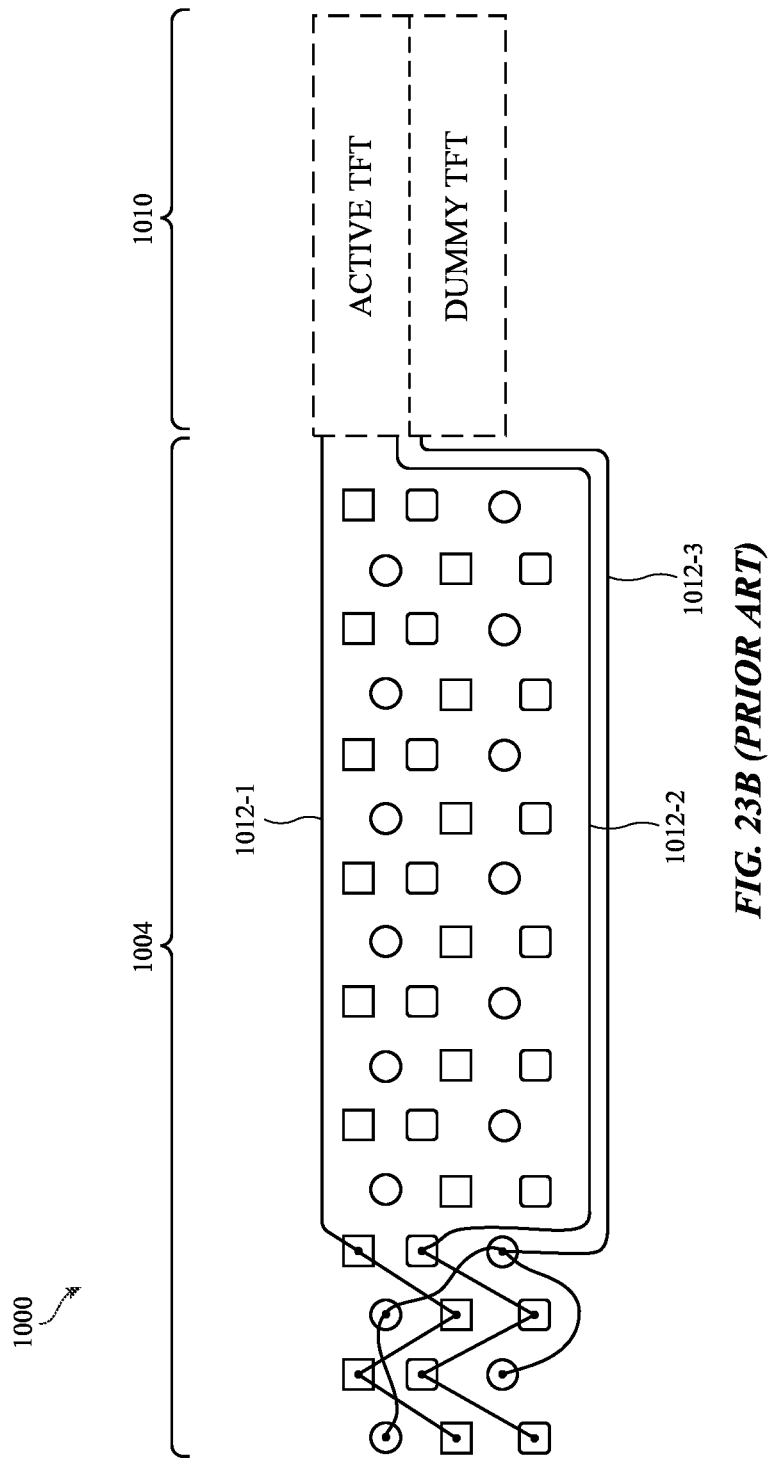

Thin-film transistors used to drive emissive pixels in area 1004 are positioned in transition areas 1010. As shown in FIG. 23B, transition region 1010 includes some active thin-film transistors (TFTs) that drive pixels in area 1004. Transition region 1010 also includes dummy TFTs. No TFTs are included in area 1004 (over the camera).

In FIG. 23B (a top view of the prior art display of FIG. 23A), the square pixels are green pixels, the circular pixels are red pixels, and the square pixels with rounded corners are blue pixels. Groups of four emissive pixels are shorted together and controlled using a single thin-film transistor. As shown in FIG. 23B, a first signal line 1012-1 is electrically connected to a group of four green pixels, a second signal line 1012-2 is electrically connected to a group of four blue pixels, and a third signal line 1012-3 is electrically connected to a group of four red pixels. This pattern (with signal lines controlling groups of four shorted emissive pixels) may hold true across area 1004. The same pattern is used for each row of pixels in area 1004.

The foregoing is merely illustrative and various modifications can be made by those skilled in the art without departing from the scope and spirit of the described embodiments. The foregoing embodiments may be implemented individually or in any combination.

What is claimed is:

1. An electronic device, comprising:
    an input-output component; and
    a display having a plurality of emissive sub-pixels of first, second, and third colors arranged in an array and a plurality of thin-film transistor sub-pixels that control the emissive sub-pixels, wherein the display comprises:
        a first portion in which there is one emissive sub-pixel for each thin-film transistor sub-pixel; and
        a second portion that overlaps the input-output component, wherein, in the second portion:
            for the first color, there is a first number of emissive sub-pixels and there is one emissive sub-pixel for each thin-film transistor sub-pixel;
            for the second color, there is a second number of emissive sub-pixels and there are two emissive sub-pixels for each thin-film transistor sub-pixel; and
            for the third color, there is a third number of emissive sub-pixels, the first number is less than the second or third numbers, and there are two emissive sub-pixels for each thin-film transistor sub-pixel.

2. The electronic device defined in claim 1, wherein the first color is blue.

3. The electronic device defined in claim 1, wherein the first color is green.

4. The electronic device defined in claim 3, wherein rows of the green emissive sub-pixels in the second portion are shifted relative to corresponding rows of the green emissive sub-pixels in the first portion.

5. The electronic device defined in claim 1, wherein the thin-film transistor sub-pixels for the second portion are evenly distributed across the second portion.

6. The electronic device defined in claim 1, wherein, in the second portion, pairs of emissive sub-pixels of the second color are shorted together and pairs of emissive sub-pixels of the third color are shorted together.

7. An electronic device, comprising:
    an input-output component; and
    a display having an array of pixels, wherein the display has a first portion having a first pixel density and a second portion having a second pixel density that is lower than the first pixel density, wherein the second portion overlaps the input-output component, wherein the second portion of the display includes emissive sub-pixels that emit light and thin-film transistor sub-pixels that control the emissive sub-pixels, wherein each thin-film transistor sub-pixel in the second portion of the display controls two respective emissive sub-pixels, wherein the emissive sub-pixels are arranged in an array of rows and columns, wherein, in the second portion of the display, a first emissive sub-pixel of a first color in a first row and a first column is shorted to a second emissive sub-pixel of the first color in the first row and a second column, wherein the second emissive sub-pixel is adjacent to the first emissive sub-pixel in a first direction, wherein, in the second portion of the display, a third emissive sub-pixel of the first color in a second row and the first column is shorted to a fourth emissive sub-pixel of the first color in the second row and a third column, wherein the fourth emissive sub-pixel is adjacent to the third emissive sub-pixel in a second direction, wherein the second row is adjacent to the first row, and wherein the second direction is opposite the first direction.

8. The electronic device defined in claim 7, wherein the second column is subsequent to the first column and the third column precedes the first column.

9. The electronic device defined in claim 7, wherein the first color is blue or red.

10. The electronic device defined in claim 7, wherein, in the second portion of the display, a fifth emissive sub-pixel of a second color in the first row and a fourth column is shorted to a sixth emissive sub-pixel of the second color in the first row that is adjacent to the fifth emissive sub-pixel in the first direction and wherein, in the second portion of the display, a seventh emissive sub-pixel of the second color in the second row and the fourth column is shorted to an eighth emissive sub-pixel of the second color in the second row that is adjacent to the seventh emissive sub-pixel in the second direction.

11. The electronic device defined in claim 10, wherein the first color is blue and the second color is red.

12. The electronic device defined in claim 7, wherein, in the second portion of the display, a fifth emissive sub-pixel of a second color in the first row and a fourth column is shorted to a sixth emissive sub-pixel of the second color in the first row that is adjacent to the fifth emissive sub-pixel in the first direction and wherein, in the second portion of the display, a seventh emissive sub-pixel of the second color in the second row and the fourth column is shorted to an eighth emissive sub-pixel of the second color in the fourth row that is adjacent to the seventh emissive sub-pixel in the first direction.

13. The electronic device defined in claim 12, wherein the first color is blue or red and the second color is green.

14. The electronic device defined in claim 7, wherein the second direction is parallel to the first direction.

15. The electronic device defined in claim 7, wherein the thin-film transistor sub-pixels are evenly distributed across the second portion.

\* \* \* \* \*